(12) United States Patent
Sukegawa et al.

(10) Patent No.: US 7,626,552 B2
(45) Date of Patent: Dec. 1, 2009

(54) SEMICONDUCTOR DEVICE, SUBSTRATE, EQUIPMENT BOARD, METHOD FOR PRODUCING SEMICONDUCTOR DEVICE, AND SEMICONDUCTOR CHIP FOR COMMUNICATION

(75) Inventors: Shunichi Sukegawa, Ibaraki (JP); Takeo Sekino, Saitama (JP); Kenichi Shigenami, Kanagawa (JP); Shinichi Toi, Kanagawa (JP); Tatsuo Shimizu, Chiba (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/026,842

(22) Filed: Feb. 6, 2008

(65) Prior Publication Data

US 2008/0150834 A1 Jun. 26, 2008

Related U.S. Application Data

(62) Division of application No. 11/202,180, filed on Aug. 12, 2005, now Pat. No. 7,400,038.

(30) Foreign Application Priority Data

Aug. 24, 2004 (JP) ............................. 2004-244019
Jul. 21, 2005 (JP) ............................. 2005-211753

(51) Int. Cl.
*H01Q 1/38* (2006.01)
*H01L 23/34* (2006.01)
(52) U.S. Cl. ................................. 343/700 MS; 257/724
(58) Field of Classification Search .......... 343/700 MS, 343/702, 895; 257/48, 65, 724–7
See application file for complete search history.

(56) References Cited

U.S. PATENT DOCUMENTS

| 5,896,111 | A | * | 4/1999 | Houdeau et al. ............ 343/867 |
| 6,274,937 | B1 | | 8/2001 | Ahn et al. |
| 6,664,645 | B2 | * | 12/2003 | Kawai ........................ 257/778 |
| 7,394,425 | B2 | * | 7/2008 | Luch .................. 343/700 MS |
| 2002/0159242 | A1 | | 10/2002 | Nakatani et al. |
| 2005/0194591 | A1 | * | 9/2005 | Usami et al. .................. 257/48 |
| 2007/0169336 | A1 | * | 7/2007 | Luch .......................... 29/601 |
| 2008/0054427 | A1 | * | 3/2008 | Usami et al. ................ 257/679 |

OTHER PUBLICATIONS

U.S. Appl. No. 12/026,908, filed Feb. 6, 2008, Sukegawa, et al.
U.S. Appl. No. 12/026,884, filed Feb. 6, 2008, Sukegawa, et al.

* cited by examiner

*Primary Examiner*—Huedung Mancuso
(74) *Attorney, Agent, or Firm*—Oblon, Spivak, McClelland, Maier & Neustadt, P.C.

(57) ABSTRACT

A semiconductor device includes a first substrate having a first surface for mounting an electronic component and a second surface substantially parallel to the first surface. The first substrate includes a first region for mounting the electronic component, a second region including a plurality of first communication units for transmitting and receiving signals to and from a second substrate, input-output circuits disposed on the first region or the second region, the input-out circuits corresponding to the first communication units, and a control circuit for controlling input to and output from the input-output circuits disposed on the first region or the second region of the first substrate. Each of the input-output circuits includes an output circuit for outputting a signal to a second communication unit of the second substrate corresponding to the first communication unit and an input unit for receiving a signal sent from the corresponding second communication unit.

7 Claims, 41 Drawing Sheets

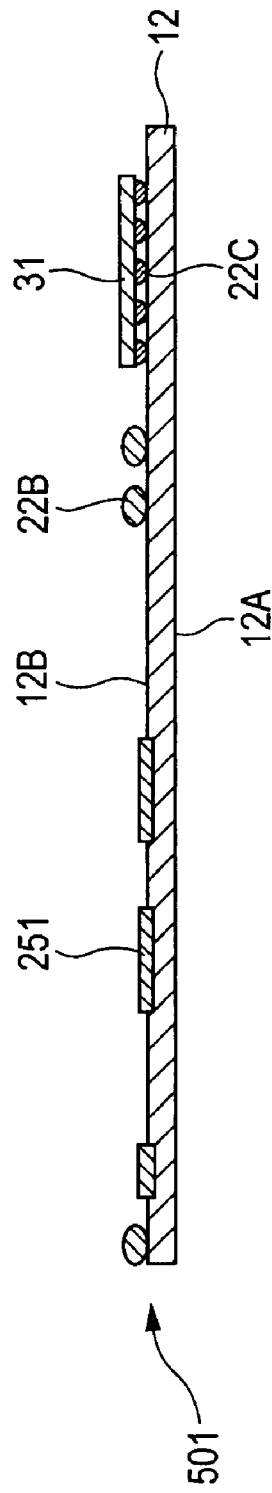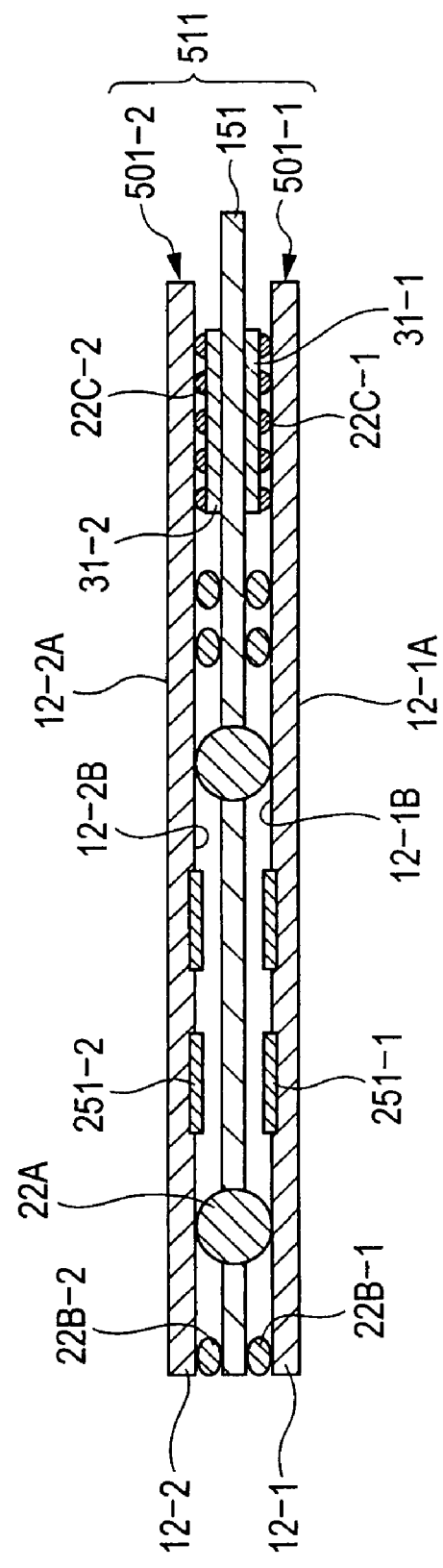

FIG. 33A  DATA [V] 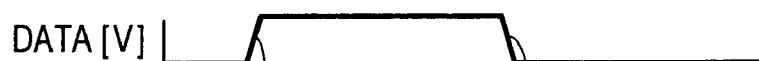
FIG. 33B  N0 [V] 
FIG. 33C  N5 [V] 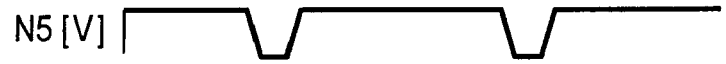
FIG. 33D  ILT [A] 
FIG. 33E  N3/N4T [V] 

FIG. 35A  IN [V] 
FIG. 35B  N3 / N4T [V] 
FIG. 35C  VA [V] 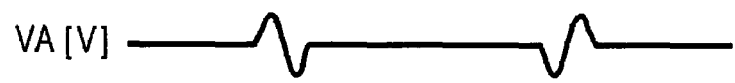
FIG. 35D  N5 [V] 
FIG. 35E  N6 [V] 
FIG. 35F  OUT [V] 

FIG. 40
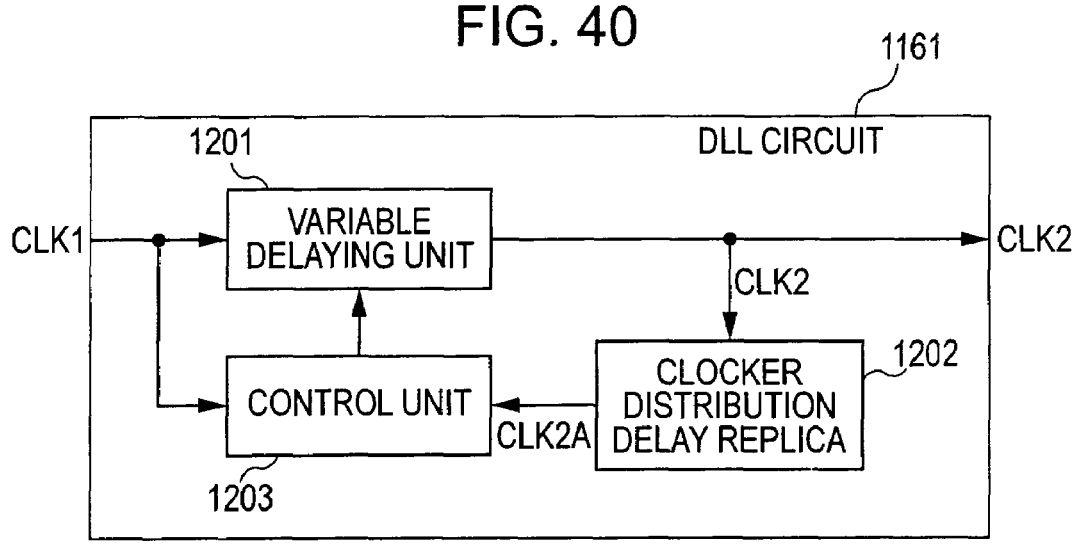
FIG. 41A    1184-08 N3/N4 [V] 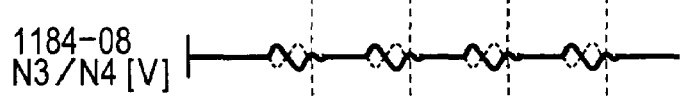
FIG. 41B    CLK1 
FIG. 41C    CLK2 
FIG. 41D    1184-01 N3/N4 [V] 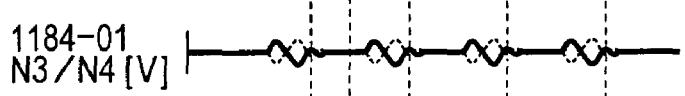
FIG. 41E    NC1 
FIG. 41F    NC2 (CLK2A) 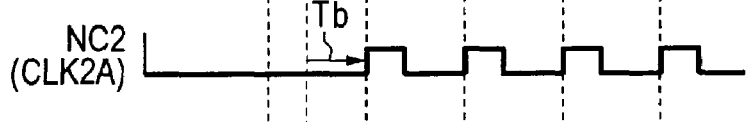

FIG. 43A  CLK [V] 
FIG. 43B  N3 [V] 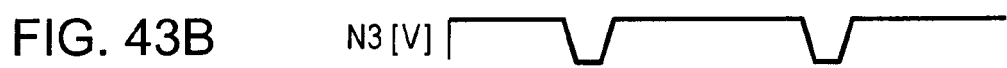
FIG. 43C  DATA [V] 
FIG. 43D  ILT [A] 
FIG. 43E  N3/N4T [V] 

SEMICONDUCTOR DEVICE, SUBSTRATE, EQUIPMENT BOARD, METHOD FOR PRODUCING SEMICONDUCTOR DEVICE, AND SEMICONDUCTOR CHIP FOR COMMUNICATION

CROSS REFERENCES TO RELATED APPLICATIONS

The present Divisional Application claims the benefit of priority under 35 U.S.C. §120 to application Ser. No. 11/202,180, filed on Aug. 12, 2005, and under 35 U.S.C. §119 from Japanese Patent Applications JP 2004-244019 filed on Aug. 24, 2004, and JP 2005-211753 filed on Jul. 21, 2005, the entire contents of which are incorporated herein by reference.

BACKGROUND OF THE INVENTION

1. Field of the Invention

The present invention relates to a semiconductor device, a substrate, an equipment board, a method for producing the semiconductor device, and a semiconductor chip for communication and, more specifically, to a semiconductor device, a substrate, an equipment board, a method for producing the semiconductor device, and a semiconductor chip for communication capable of reducing the size of the semiconductor device.

2. Description of the Related Art

Along with the wide-spread use of electronic apparatuses, laminating technology and inter-chip wiring technology for realizing multi-chip packages and system-in-packages (SIPs) at a low cost have been proposed (for example, refer to Japanese Unexamined Patent Application Publication No. 8-316408).

The above-mentioned publication describes a method for stacking a plurality of substrates, bonding another substrate to a side surface of the stacked substrates, and connecting terminals of the stacked substrates to terminals provided in a lower area via the substrate bonded to stacked substrates.

In the method described in Japanese Unexamined Patent Application Publication No. 8-316408, the number of terminals is limited due to the width of the side surface of the substrate. To increase the number of terminals, the number of substrates bonded to the side surfaces must be increased. Since there are only four side surfaces of the substrate, the maximum length available for the terminals is four times the width of a side surface of the substrate. Therefore, to increase the number of terminals, the width of the side surfaces of the substrate must be increased. However, increasing the width of the side surfaces of the substrate also increases the overall size of the semiconductor device.

A semiconductor device according to an embodiment of the present invention is capable of providing a large number of terminals while reducing the overall size of the semiconductor device.

SUMMARY OF THE INVENTION

A semiconductor device according to an embodiment of the present invention includes a first substrate including a flat body having a first surface for mounting an electronic component and a second surface substantially parallel to the first surface. The first and second surfaces are disposed parallel to each other in the width direction of the substrate. The first substrate includes a first region on the flat body for mounting the electronic component, a second region on the flat body including a plurality of first communication units, provided in a cluster, for transmitting and receiving signals to and from a second substrate, input-output circuits disposed on the first region or the second region, and a control circuit for controlling input to and output from the input-output circuits. The input-out circuits correspond to the first communication units, and each of the input-output circuits include an output circuit for outputting a signal to a second communication unit of the second substrate corresponding to the first communication unit and an input unit for receiving a signal sent from the corresponding second communication unit. The control circuit is configured to control input to and output from the input-output circuits and is disposed on the first region or the second region of the first substrate.

The semiconductor device may include a connection-switching circuit for switching the connection between one of the first communication units and a predetermined terminal of the electronic component. The connection-switching circuit is disposed on the first region or the second region of the first substrate.

In the semiconductor device, the first communication units may be first through-holes. The first through-holes in the second region of the first substrate are electrically connected to second through-holes on the second substrate at positions corresponding to the first through-holes in the second region of the first substrate via first bumps. The second substrate is disposed adjacent to and substantially parallel to the flat body of the first substrate.

The semiconductor may further include a planar metal thin film disposed substantially parallel to and apart from the flat body of the first substrate. The metal thin film is bonded to the first substrate with second bumps, wherein he second bumps are interposed between the metal thin film and the substrate.

In the semiconductor device, the electronic component may be disposed in contact with the metal thin film so that heat generated by the electronic component is dissipated.

In the semiconductor device, the metal thin film may be disposed in the second region of the first substrate so that the metal thin film surrounds each of the first communication units.

In the semiconductor device, part of the metal thin film may protrude outside the first region of the first substrate.

In the semiconductor device, the metal thin film may supply electrical power to the electronic component via the second bumps.

In the semiconductor device, the first communication units may be antennas.

A semiconductor device according to another embodiment of the present invention includes a plurality of substrates including first to fourth substrates. Each of the first to fourth substrates include a flat body having a first surface for mounting an electronic component and a second surface substantially parallel to the first surface, the first and second surfaces being disposed parallel to each other in the width direction of the substrate. A first electronic component is mounted on the first substrate. A second electronic component is mounted on the second substrate. The second substrate is disposed so that the first surface of the first substrate and the first surface of the second substrate oppose each other. A third electronic component is mounted on the third substrate. A fourth electronic component is mounted on the fourth substrate. The fourth substrate is disposed so that the first surface of the third substrate and the first surface of the fourth substrate oppose each other. Antennas for receiving signals are formed on the second substrate and on the third substrate disposed adjacent to the second substrate at positions corresponding each other with respect to the second substrate and the third substrate.

In the semiconductor device, the antennas may be formed in a cluster on the flat body of each of the substrates.

The semiconductor device may further include a connection-switching circuit for switching the connection between one of the antennas and a predetermined terminal of the electronic component.

The semiconductor device may further include planar metal thin films each disposed substantially parallel to the flat bodies of the substrates, wherein the metal thin films supply electrical power to the electronic components disposed on the substrates.

In the semiconductor device, the metal thin films may include a first metal thin film disposed substantially parallel to and apart from the flat bodies of the first and second substrates and connected to the first and second substrates via bumps and a second metal thin film disposed substantially parallel to and apart from the flat bodies of the third and fourth substrates and connected to the third and fourth substrates via bumps. The first metal thin film and the second metal thin film are connected to each other.

In the semiconductor device, the metal thin films may include a first metal thin film disposed substantially parallel to and apart from the flat body of the first substrate and connected to the first substrate via bonding wires, a second metal thin film disposed substantially parallel to and apart from the flat body of the second substrate and connected to the second substrate via bonding wires, a third metal thin film disposed substantially parallel to and apart from the flat body of the third substrate and connected to the third substrate via bonding wires, and a fourth metal thin film disposed substantially parallel to and apart from the flat body of the fourth substrate and connected to the fourth substrate via bonding wires. The first to fourth metal thin films are connected to each other.

In the semiconductor device, the first substrate may include a fifth substrate having a plurality of via-holes and being connected to the first substrate via bumps, the second substrate may include a sixth substrate having a plurality of via-holes, being connected to the second substrate via bumps, and being connected to the via-holes of the fifth substrate provided at positions corresponding to the via-holes of the second substrate via bumps, the third substrate may include a seventh substrate having a plurality of via-holes and being connected to the third substrate via bumps, and the fourth substrate may include a eighth substrate having a plurality of via-holes, being connected to the fourth substrate via bumps, and being connected to the via-holes of the seventh substrate provided at positions corresponding to the via-holes of the fourth substrate via bumps.

In the semiconductor device, the first substrate may include a first spacer having a first end bonded to the first spacer, the second substrate may include a second spacer having a first end bonded to the second substrate and a second end bonded to the first spacer with bumps, which are interposed between the first spacer and the second spacer, the third substrate may include a third spacer having a first end bonded to the third spacer, and the fourth substrate may include a fourth spacer having a first end bonded to the fourth substrate and a second end bonded to the third spacer with bumps, which are interposed between the third spacer and the fourths spacer.

A substrate according to another embodiment of the present invention includes a first region on the flat body for mounting the electronic component, a second region on the flat body including a plurality of first communication units, provided in a cluster, for transmitting and receiving signals to and from a second substrate, input-output circuits disposed on the first region or the second region, the input-out circuits corresponding to the first communication units, and a control circuit for controlling input to and output from the input-output circuits disposed on the first region or the second region of the first substrate. Each of the input-output circuits includes an output circuit for outputting a signal to a second communication unit of the second substrate corresponding to the first communication unit and an input unit for receiving a signal sent from the corresponding second communication unit.

An equipment board according to another embodiment of the present invention includes a semiconductor device including a plurality of inner substrates on which electronic components are disposed, a first outer substrate where the semiconductor device is mounted, and a second outer substrate provided at a position where the semiconductor device is to be mounted on the first outer substrate. At least the outermost inner substrate has an antenna for receiving signals. The first outer substrate includes an antenna disposed at a position corresponding to the antenna included in the semiconductor device.

A method for producing a semiconductor device according to another embodiment of the present invention includes the steps of forming antennas at predetermined positions on a plurality of substrates, which corresponding to each other with respect to the substrates, disposing chips at predetermined positions on a first surface of each of the substrates, forming pairs of the substrates so that the first surfaces of the substrates oppose each other, assembling the pairs of the substrates so that the antennas are positioned at predetermined positions correspond to each other, and molding the second pairs.

A semiconductor chip for communication disposed on a substrate includes a planar matrix of communication modules. Each of the communication modules includes an antenna, which formed of a coiled pattern, for transmitting or receiving radio signals, at least one of a transmitter circuit for transmitting a signal to the antenna and a receptor circuit for receiving a signal from the antenna, and wiring for supplying electrical power and signals to one of the transmitter circuit and the receptor circuit.

In the semiconductor chip for communication, each of the communication modules may include both the transmitter circuit and the receptor circuit, the antenna may be connected to an output of the transmitter circuit and an input of the receptor circuit, and the transmitter circuit and the receptor circuit may include terminals that can be individually set to one of an enabled state and a disabled state.

The semiconductor chip for communication may further include a control unit for commonly controlling the communication modules.

In the semiconductor chip for communication, at least one of the receptor circuits of the communication modules may be an asynchronous receptor circuit and the other receptor circuits are synchronous receptor circuits, and the semiconductor chip for communication may further include a modulating circuit for modulating a clock signal supplied to the synchronous receptor circuits based on a signal from the asynchronous receptor circuit.

A semiconductor device according to another embodiment of the present invention includes a plurality of substrates including semiconductor chips having predetermined functions and being disposed substantially parallel to each other. The semiconductor chips are for communication and are disposed at positions corresponding to the each other with respect to the substrates. Each of the semiconductor chips include a planar matrix of a plurality of communication modules having formed of coiled patterns antennas for receiving or transmitting radio signals.

In the semiconductor device, additional semiconductor chips for radio-communicating with semiconductor chips mounted on an outer substrate may be mounted on one of the substrates disposed closest to the outer substrate.

In the semiconductor device, a depression may be formed at a position corresponding to the semiconductor chip for communication mounted on the outer substrate.

In the semiconductor device, each of the communication modules may include an antenna, at least one of a transmitter circuit for transmitting a signal to the antenna and a receptor circuit for receiving a signal from the antenna, and wiring for supplying electrical power and signals to one of the transmitter circuit and the receptor circuit.

In the semiconductor device, each of the communication modules may include both the transmitter circuit and the receptor circuit, the antenna may be connected to an output of the transmitter circuit and an input of the receptor circuit, and the transmitter circuit and the receptor circuit may include terminals that can be individually set to one of an enabled state and a disabled state.

The semiconductor device may further include a control unit for commonly controlling the communication modules.

In the semiconductor device, at least one of the receptor circuits of the communication modules may be an asynchronous receptor circuit and the other receptor circuits are synchronous receptor circuits, and the semiconductor chip for communication may further include a modulating circuit for modulating a clock signal supplied to the synchronous receptor circuits based on a signal from the asynchronous receptor circuit.

According to an embodiment of the present invention, a first region on the flat body for mounting the electronic component and a second region on the flat body including a plurality of first communication units, provided in a cluster, for transmitting and receiving signals to and from a second substrate are provided. An input and output circuit corresponding each of the first communication units are provided.

According to an embodiment of the present invention, pairs of substrates formed by opposing first surfaces having electronic components are assembled and antennas are formed on a second substrate and a third substrate disposed adjacent to the second substrate at positions corresponding to each other.

According to an embodiment of the present invention, a second region having a cluster of communication units is formed on a substrate in a region other than a first region including an electronic component.

According to an embodiment of the present invention, a first outer substrate is disposed on a second outer substrate and antennas are disposed at predetermined positions on the first outer substrate and a semiconductor device disposed on the first outer substrate.

According to an embodiment of the present invention, a chip is disposed at a predetermined position on a first surface of a substrate, two substrates are paired so that the first surfaces having the chips oppose each other, the pair of substrates are assembled so that coils are disposed at corresponding positions, and the substrates are molded.

A semiconductor chip according to an embodiment of the present invention mounted on a substrate includes a plurality of communication units disposed as a planar matrix. In the communication units, signals are transmitted from transmitter circuits via antennas, constituted of coiled patterns, and signals from the antennas are received by receptor circuits.

According to an embodiment of the present invention, on a substrate, a semiconductor chip capable of carrying out a predetermined function and a semiconductor chip for communication are provided. The semiconductor chip for communication includes a plurality of communication modules having antennas constituted of coiled patterns is disposed in a planar matrix and signals are transmitted and received via antennas.

BRIEF DESCRIPTION OF THE DRAWINGS

FIG. 16 is a sectional side view of a two-dimensional multi-chip produced by the method illustrated in FIG. 15;

FIG. 17 is a sectional side view of a three-dimensional multi-chip produced by the method illustrated in FIG. 15;

FIG. 33 is a waveform diagram illustrating the operation of the transmitter circuit illustrated in FIG. 32;

FIG. 35 is a waveform diagram illustrating the operation of the transmitter circuit illustrated in FIG. 34;

FIG. 40 is a block diagram illustrating the structure of a DLL circuit;

FIG. 41 a waveform diagram illustrating the operation of the DLL circuit illustrated in FIG. 40;

FIG. 43 a waveform diagram illustrating the operation of the transmitter circuit illustrated in FIG. 42;

DESCRIPTION OF THE PREFERRED EMBODIMENTS

Embodiments of the present invention will be described below with reference to the drawings.

Figure 1:
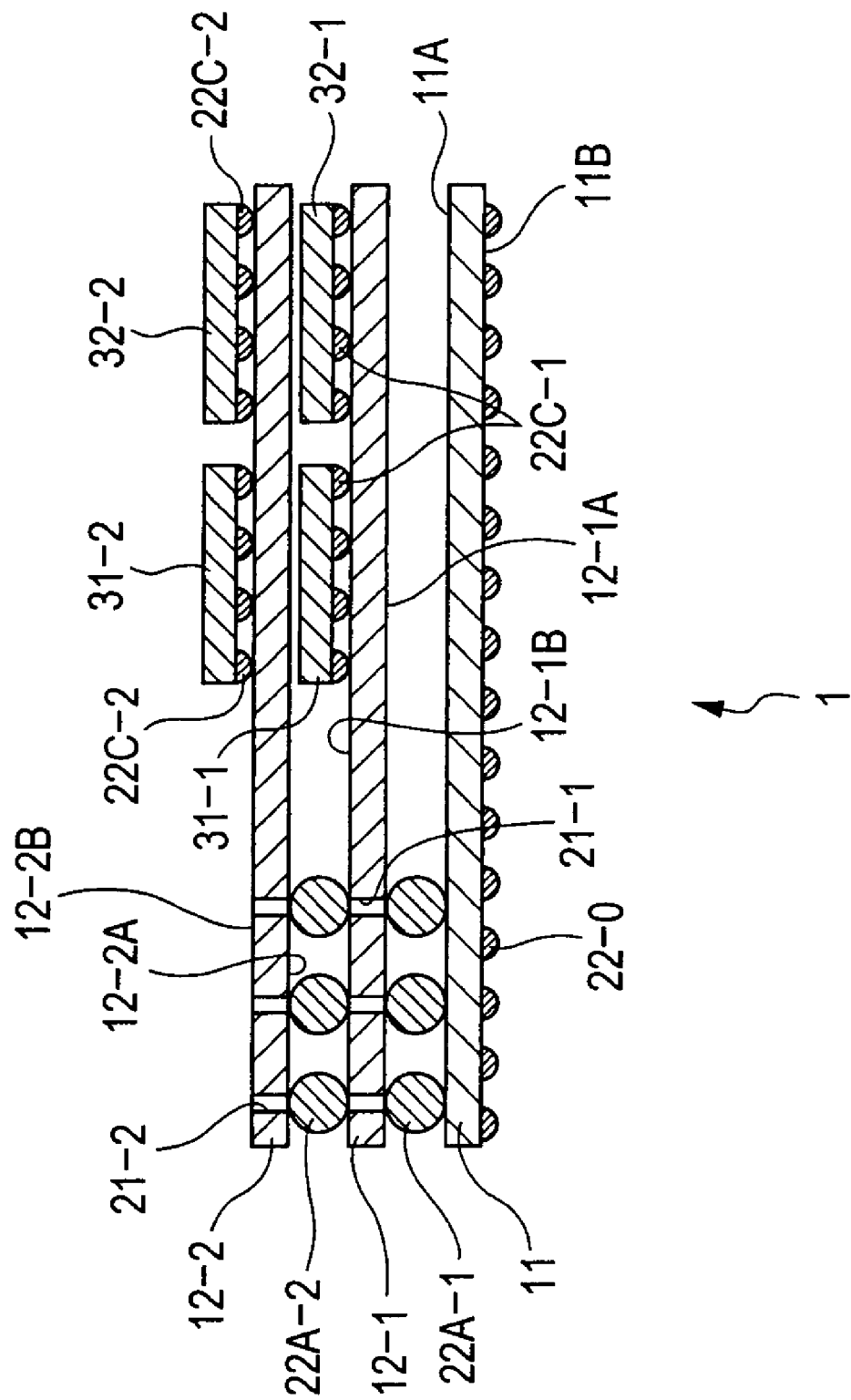
FIG. 1 is a sectional side view of a three-dimensional multi-chip according to an embodiment of the present invention.
Figure 2:
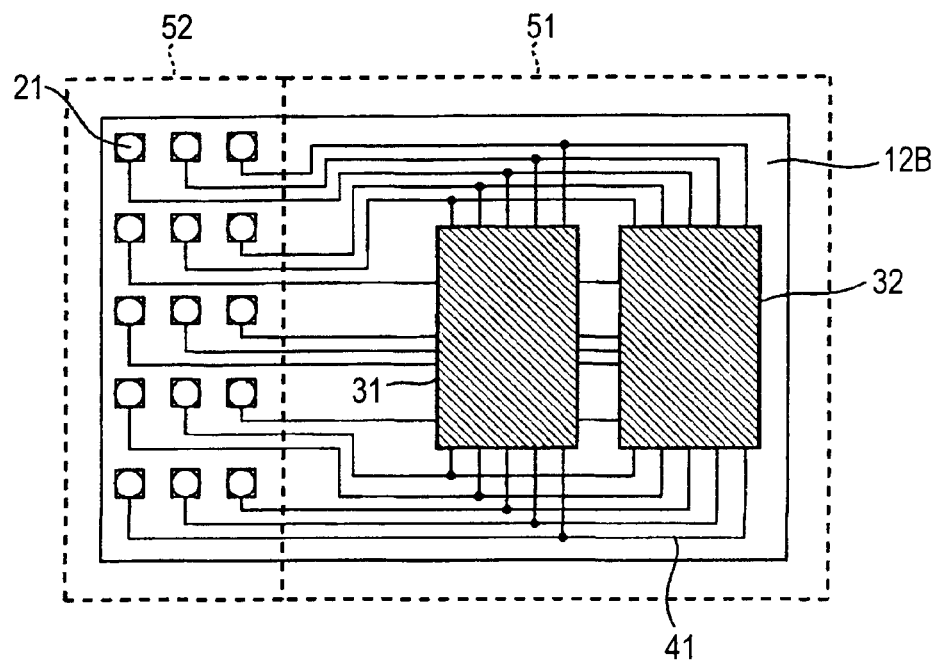
FIG. 2 is a plan view of the three-dimensional multi-chip illustrated in FIG. 1.

FIG. 1 is a cross-sectional view of a three-dimensional multi-chip according to an embodiment of the present invention. FIG. 2 is a plan view of the three-dimensional multi-chip illustrated in FIG. 1. A three-dimensional multi-chip 1 is formed by stacking an interposer 12-1 and an interposer 12-2 on a substrate 11 in order (hereinafter, when the interposer 12-1 and the interposer 12-2 do not have to distinguished from each other, the interposer 12-1 and the interposer 12-2 will collectively be referred to as interposers 12). The substrate 11 has surfaces 11A and 11B that are flat surfaces substantially parallel to each other in the width direction. The surface 11B is connected to other devices (not shown in the drawings) via bumps 22-0. The interposer 12-1 that has a plurality of through-holes 21-1, functioning as transmission units, is disposed above the surface 11A. The interposer 12-1 has surfaces 12-1A and 12-1B that are flat surfaces substantially parallel to each other in the width direction. Chips 31-1 and 32-1 are disposed on bumps 22C-1 provided on the surface 12-1B.

The interposer 12-2 is disposed above the surface 12-1B of the interposer 12-1. The interposer 12-2 also has surfaces 12-2A and 12-2B that are flat surfaces disposed substantially parallel with each other in the width direction. Chips 31-2 and 32-2 are disposed on bumps 22C-2 provided on the surface 12-2B.

Accordingly, in the three-dimensional multi-chip 1 according to this embodiment, the interposer 12-1 and interposer 12-2, which are substrates, are stacked in this order in a manner such that the surface 12-2A and the surface 12-2B, where the chips are disposed, face upward.

The edges of through-holes 21-2 at the surface 12-2A of the interposer 12-2 are connected to the edges of the through-holes 21-1 at the surface 12-2B of the interposer 12-1 via bumps 22A-2. The edges of the through-holes 21-1 at the surface 12-1A of the interposer 12-1 are connected to a predetermined wiring pattern (not shown in the drawings) on the surface 11A of the substrate 11.

As illustrated in FIG. 2, a region 51 where chips are disposed and a region 52 where a plurality of through-holes 21 are formed in a cluster are defined on a flat surface of each of the interposers 12. In this embodiment, the region 52 is on the left side of the flat surface of each of the interposers 12. FIG. 2 illustrates a 3×5 matrix of the through-holes 21. However, the number of through-holes 21 is not limited. Chips 31 and 32, which are electronic components constituted of integrated circuits (ICs) or large-scale integrated circuits (LSIs), are disposed in the region 51. The number of chips to be mounted in the region 51 is not limited. The chips may be directly embedded in the interposers 12.

Each terminal of the chips 31 and 32 is connected to one of the through-holes 21 in the region 52 via a line of wiring pattern 41.

The regions 51 and 52 are defined in each of the interposers 12. More specifically, the same number of through-holes 21 is formed at the same positions in the region 52 relative to each interposer 12. The remaining region on each interposer 12 is defined as the region 51 where the chips are disposed.

By providing the through-holes 21 at the same positions and defining the regions 51 and 52 in the same area in each interposer 12, a plurality of interposers 12 can be reliably connected in sequence.

Although the number of through-holes 21 formed in the region 52 is not limited, as described above, at least a number of through-holes 21 corresponding to the number of terminals of the chips mounted on the three-dimensional multi-chip 1 (i.e., the number of signal channels that have to be able to independently transmitted and received signals) is provided. For example, if chips 31-1, 31-2, 32-1, and 32-2 each include ten terminals, a total of 40 channels are required. Hence, at least forty through-holes 21 are formed in the region 52. The inner surfaces of the through-holes 21 are formed of a conductive material so that signals can be transmitted between the edges of the through-holes 21.

For example, to transmit and receive signals between a terminal of the chip 31-2 and the outside of the three-dimensional multi-chip 1, a channel is reserved, wherein the channel includes bump 22C-2 connected to terminals of the chip 31-2, a wiring pattern (not shown in the drawing) formed on the interposer 12-2 connected to the bumps 22C-2, through-holes 21-2 connected to the wiring pattern, bumps 22A-2 connected to the through-holes 21-2, through-holes 21-1 formed on the interposer 12-1 connected to the bumps 22A-2, bumps 22A-1 connected to the through-holes 21-1, and a wiring pattern (not shown in the drawing) formed on the substrate 11 connected to the bumps 22A-1.

Among the bumps 22A-2 that connect the through-holes 21-1 of the interposer 12-1 and the through-holes 21-2 of the interposer 12-2, it is possible to omit the bumps 22A-2 of channels included in layers above the interposer 12-2 not used to transmit signals outside the three-dimensional multi-chip 1. In this way, the number of bumps 22A-2 can be decreased to lower production costs. However, it is also possible to connect all through-holes 21 formed at corresponding positions via bumps 22A so as to facilitate production.

Unused channels may be selected by a cross-bus switch 61 described below so that when the through-hole 21 that was to be used has a failure, another through-hole 21 can be used alternatively. In this way, failure of the entire three-dimensional multi-chip 1 can be prevented.

Although all through-holes 21 formed at corresponding positions are connected to each other, connection or non-connection can be selected for each interposer 12 by using an input and output circuit 110 described below with reference to FIG. 5.

Figure 3:
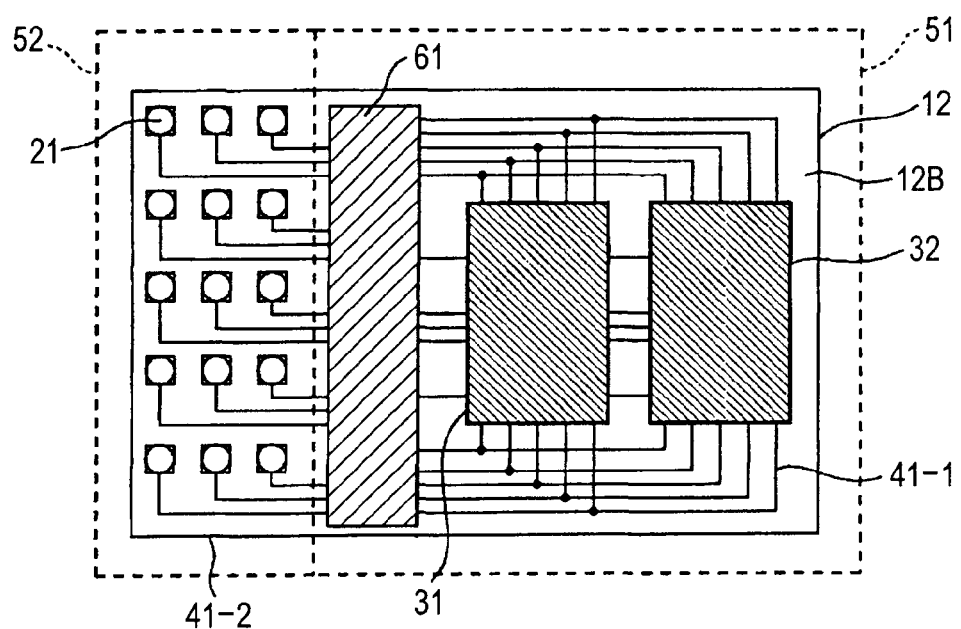
FIG. 3 is a plan view of a three-dimensional multi-chip including a cross-bus switch.

FIG. 3 illustrates one of the interposers 12 according to another embodiment. In this embodiment, the terminals of the chips 31 and 32 are connected to a cross-bus switch 61 via a wiring pattern 41-1, and the cross-bus switch 61 is connected to the through-holes 21 in the region 52 via a wiring pattern 41-2. In this embodiment, the cross-bus switch 61 is provided in the region 51. However, the cross-bus switch 61 may instead be provided in the region 52.

Figure 4:
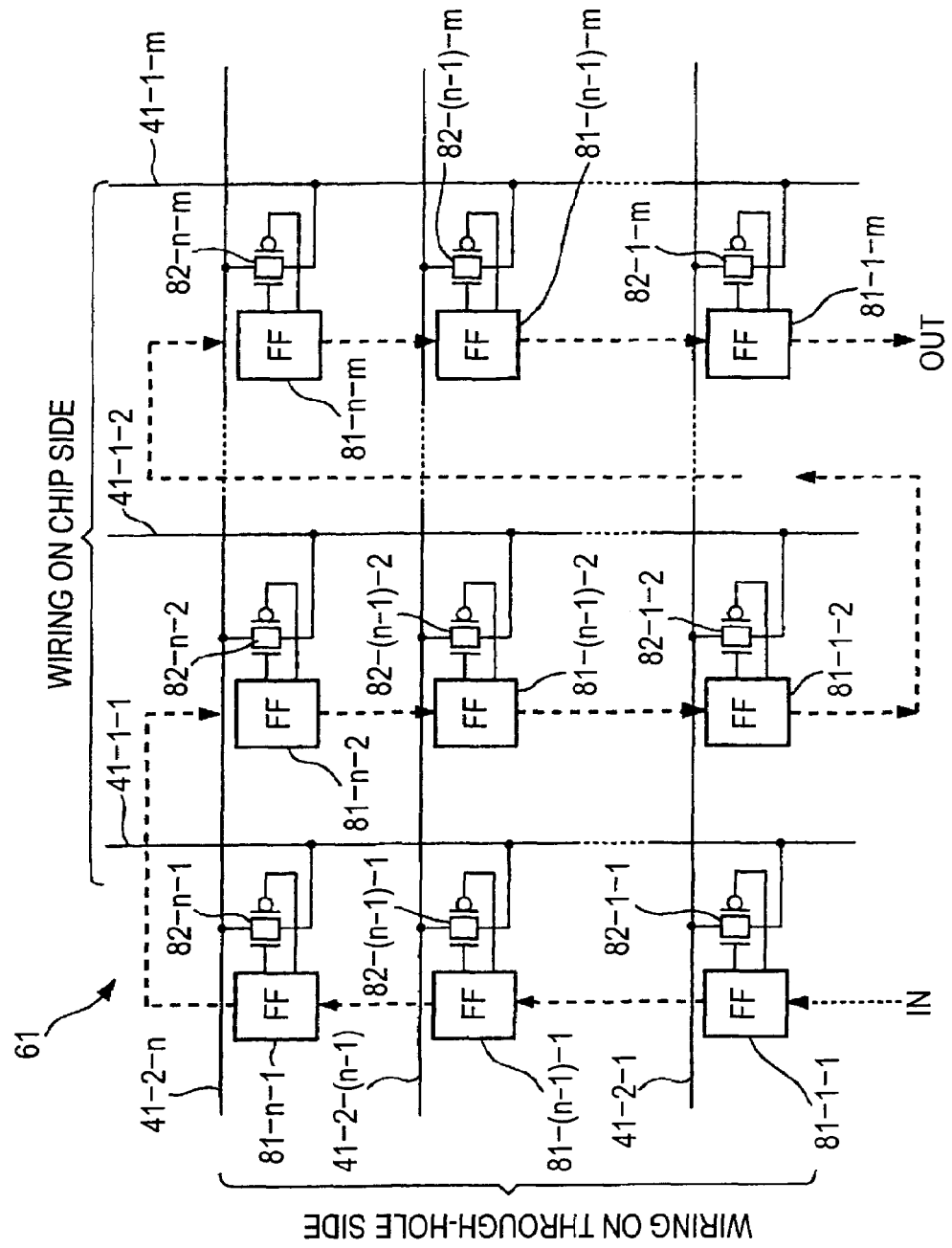
FIG. 4 is a block diagram of the structure of a cross-bus switch.

The cross-bus switch 61 has a structure such as that illustrated in FIG. 4. In this embodiment, wiring pattern lines 41-1-1 to 41-1-$m$ are connected to predetermined terminals of the chips 31 and 32. Wiring pattern lines 41-2-1 to 41-2-$n$ are connected to one of the through-holes 21.

In FIG. 4, the horizontally wiring pattern lines 41-2-1 to 41-2-$n$ and the vertically wiring pattern lines 41-2-1 to 41-2-$n$ are connected to each other via switches 82-1-1 to 82-$n$-$m$ in neighboring areas of the intersecting points, as illustrated in the drawing. The switches 82-1-1 to 82-$n$-$m$ are connected to flip-flops 81-1-1 to 81-$n$-$m$ that correspond to the switches 82-1-1 to 82-$n$-$m$. The flip-flops 81-1-1 to 81-$n$-$m$ are connected in sequence along the scan chain represented by the dashed line in the drawing. The flip-flops 81-1-1 to 81-$n$-$m$ are set to a logical value 1 or 0 in sequence along the scan chain. The horizontal and vertical wiring pattern lines corresponding to the flip-flops set to a logical value 1 are connected. For example, if a flip-flop 81-($n$-1)-2 is set to a logical value 1, the switch 82-($n$-1)-2 is turned on and the wiring pattern lines 41-2-($n$-1) and 41-1-2 are connected. Furthermore, for example, if a flip-flop 81-$n$-$m$ is set to a logical value 0, a switch 82-$n$-$m$ is turned off and a wiring pattern 42-2-$n$ and 41-1-$m$ are not connected.

In this way, by constituting the cross-bus switch 61 of flip-flops and corresponding switches, the connection state can be changed by changing the settings of the flip-flops even after a connection is established.

On the other hand, for example, by constituting the cross-bus switch 61 of a fuse read only memory (ROM) having a fuse interposed between the contact points of the horizontal and vertical wiring pattern lines, predetermined pattern lines can be connected or unconnected. In such a case, however, once a connection state or a non-connection state is established it cannot be changed.

As illustrated in FIG. 4, if the cross-bus switch 61 is constituted of flip-flops, for example, a cross-bus controller constituted of a non-volatile memory may also be provided for storing the logical values 0 and 1 set for the flip-flops so as to set the operational mode of flip-flops based on the stored logical values 0 and 1.

Figure 5:
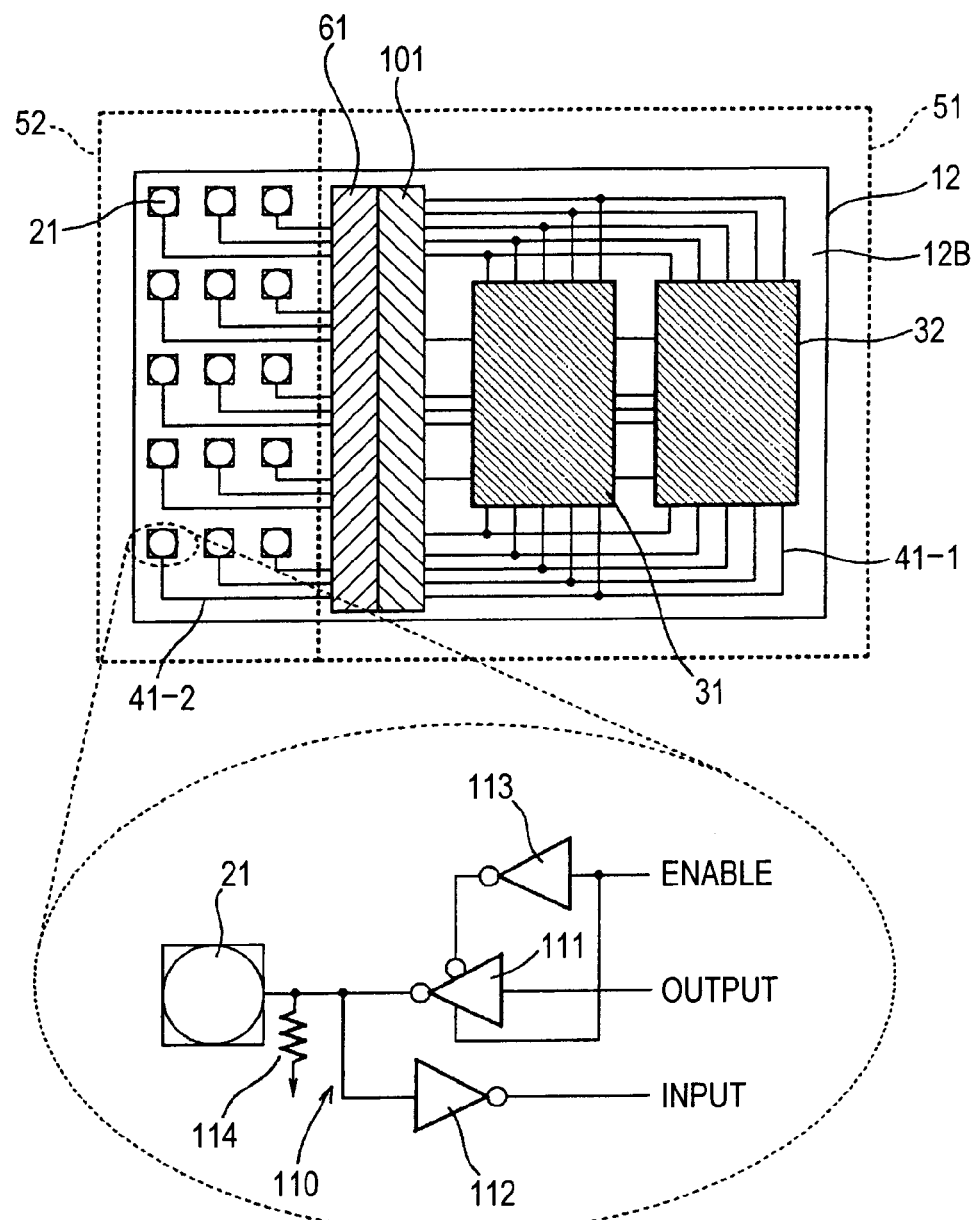
FIG. 5 is a plan view of a three-dimensional multi-chip including a cross-bus switch and a tri-state controller.

FIG. 5 illustrates another embodiment of the present invention. In this embodiment, input-output circuits 110 are connected to through-holes 21. The input-output circuits 110 are directly formed on interposers 12. Each of the input-output circuits 110 according to this embodiment includes an inverter 112 functioning as an input circuit, an inverter 111 functioning as an output circuit, an enabling inverter 113 for controlling the output circuit, and a resistor 114. A tri-state controller 101 is disposed in each region 51. For example, if a logical value 1 is supplied from the tri-state controller 101 to the enabling inverter 113 of each of the through-holes 21, the inverter 11 is turned on so as to output signals of reversed values of the logical values of the output signals from the chips 31 and 32. When a logical value 0 is input the enabling inverter 113, the output of the inverter 111 is always 0.

The inverter 112 for input inverts the logical value 0 or 1 supplied from the through-hole 21 and sends the reversed logical value to the terminal corresponding to the chips 31 and 32.

In this way, by connecting the corresponding input-output circuits 110 to the through-holes 21, a delay in data transfer due to parasitic capacitance between the lines can be prevented and, regardless of the number of interposers 12, signals can be stably transmitted and received between the interposers.

It is also possible to use interface input-output circuits, such as stub series terminated logic (SSTL) circuits or low voltage differential signaling (LVDS) circuits, as the input-output circuits 110. Furthermore, the circuits required for interfaces, such as parallel-serial conversion circuits, among the input-output circuits 110 may be disposed at predetermined positions between the chips 31 and 32 and the through-holes 21.

Figure 6:
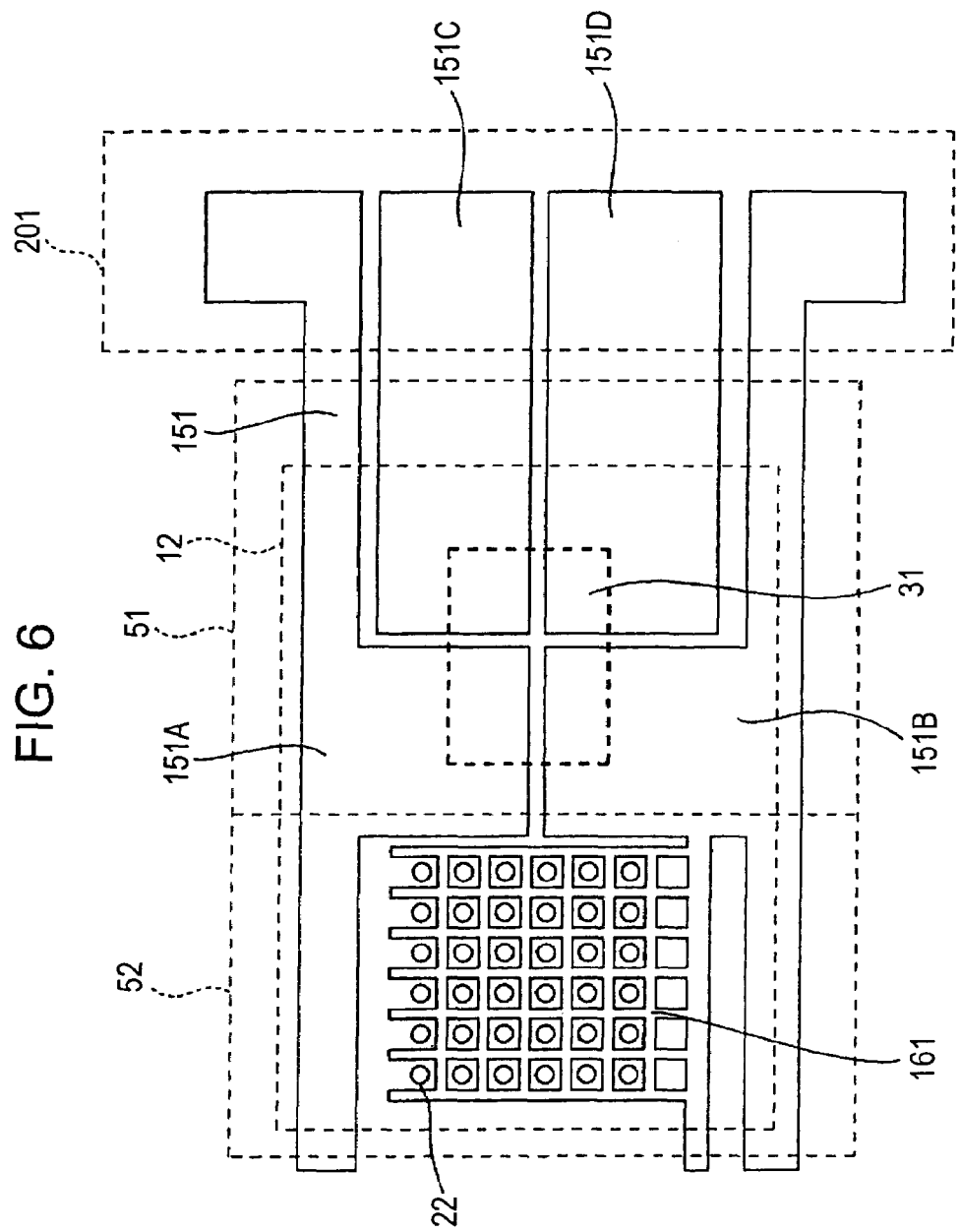
FIG. 6 is a plan view of a metal thin film.
Figure 7:
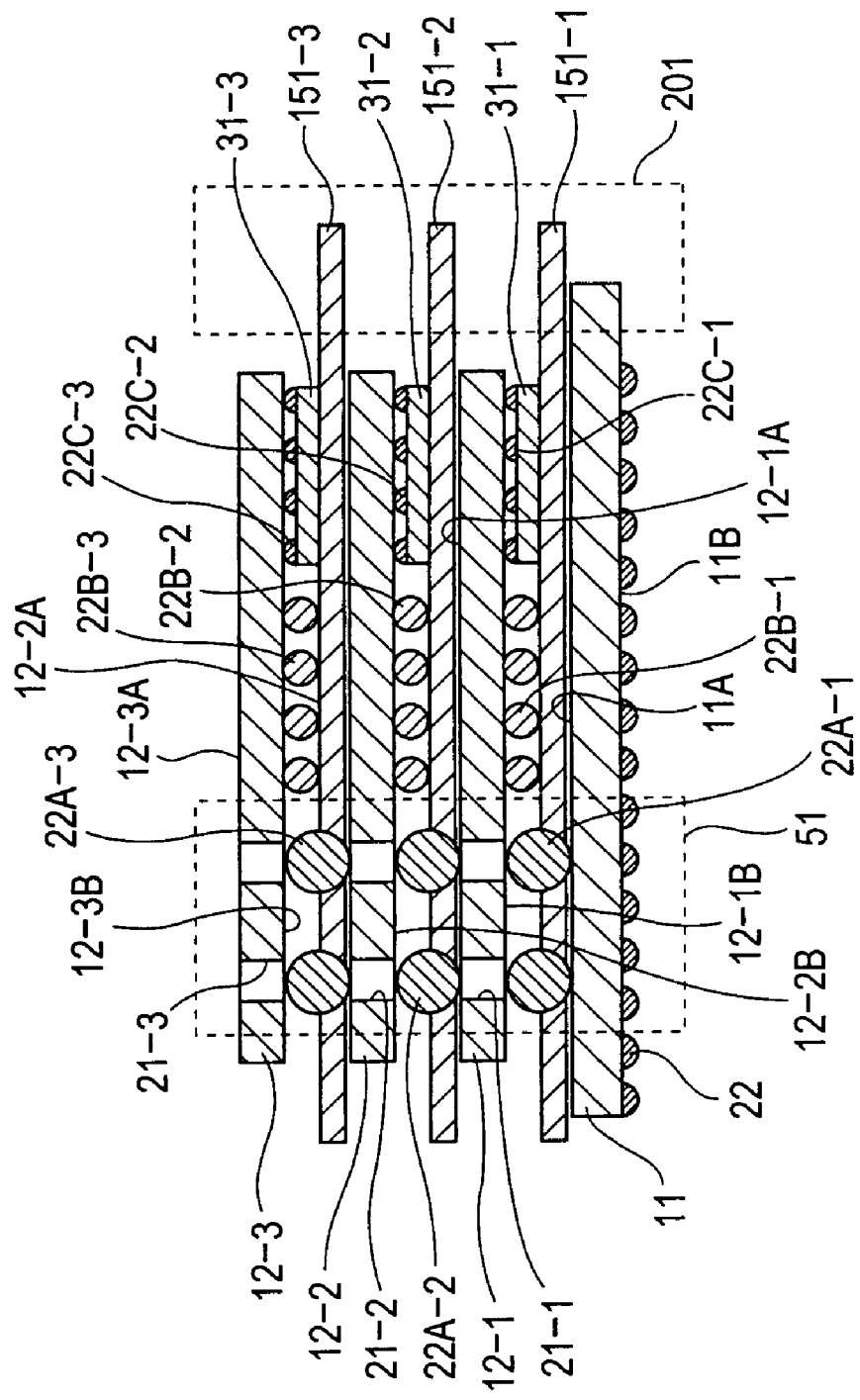
FIG. 7 is a sectional side view of a three-dimensional multi-chip, wherein metal thin films and interposers are assembled.

FIG. 6 illustrates a plan view and a sectional side view of a three-dimensional multi-chip according to another embodiment. In this embodiment, conductive metal thin films 151-1 to 151-3 corresponding to interposers 12-1 to 12-3 are provided. As illustrated in FIG. 7, the interposer 12-1 is bonded to the metal thin film 151-1 with bumps 22B-1 interposed between the interposer 12-1 and the metal thin film 151-1. A chip 31-1 is connected to a predetermined wiring pattern on a surface 12-1B of the interposer 12-1. The opposite side of the chip 31-1 is disposed in contact with the metal thin film 151-1. In this embodiment, as illustrated in FIG. 6, each of the metal thin films 151 is substantially constituted of four metal thin films 151A to 151D. The back side of the chip 31 (i.e., the surface opposite to the surface connected to the substrate with bumps interposed between the surface and the substrate) is in contact with the metal thin films 151A to 151D. Part of the heat generated at the chip 31 is conducted through the metal thin films 151A to 151D and is dissipated to the outside. To improve the efficiency of heat dissipation, a region 201 is defined on the outside of a region 51. In the region 201, the metal thin films 151A to 151D are disposed outside the interposer 12.

The same structure is employed for interposers 12-2 and 12-3. More specifically, the interposer 12-2 is bonded to a metal thin layer 151-2 with bumps 22B-2 interposed between the interposer 12-2 and the metal thin layer 151-2. The chip 31-2 is connected to the interposer 12-2 via bumps 22C-2. The back side of the chip 31-2 is in contact with the metal thin layer 151-2.

The interposer 12-3 is bonded to a metal thin layer 151-3 with bumps 22B-3 interposed between the interposer 12-3 and the metal thin layer 151-3. The chip 31-3 is connected to the interposer 12-3 via bumps 22C-3. The back side of the chip 31-3 is in contact with the metal thin layer 151-3.

The ends on the side of a surface 12-1B of through-holes 21-1 on the interposer 12-1 are connected to a surface 11B of a substrate 11 via bumps 22A-1. The ends on the side of a surface 12-1A of through-holes 21-1 on the interposer 12-1 are connected to the ends on the side of the surface 12-2B of the interposer 12-2 via bumps 22A-2. The ends on the side of a surface 12-2A of through-holes 21-2 on the interposer 12-2 are connected to the ends on the side of the surface 12-3B of through-holes 21-3 of the interposer 12-3 via bumps 22A-3.

As illustrated in FIG. 6, in a region 52, a metal thin film 151B is provided so as to form an inter-bump shield 161 that surrounds each bump 22. In this way, each bump 22 is shielded, and leakage of signals transmitted and received via the bumps 22 is prevented.

The metal thin films 151 do not only function as heat radiators but also function as a power supply for supplying electrical power from the outside to the chips 31 and 32. More specifically, for example, electrical power supplied from the outside to the metal thin films 151 is supplied to the wiring patterns of the interposers 12 via bumps 22B. Then, the electrical power is supplied from the wiring patterns to the chips 31 via bumps 22C.

Accordingly, it is possible to shorten the length of the lines of the wiring pattern for power supply formed on each interposer 12.

Figure 8:
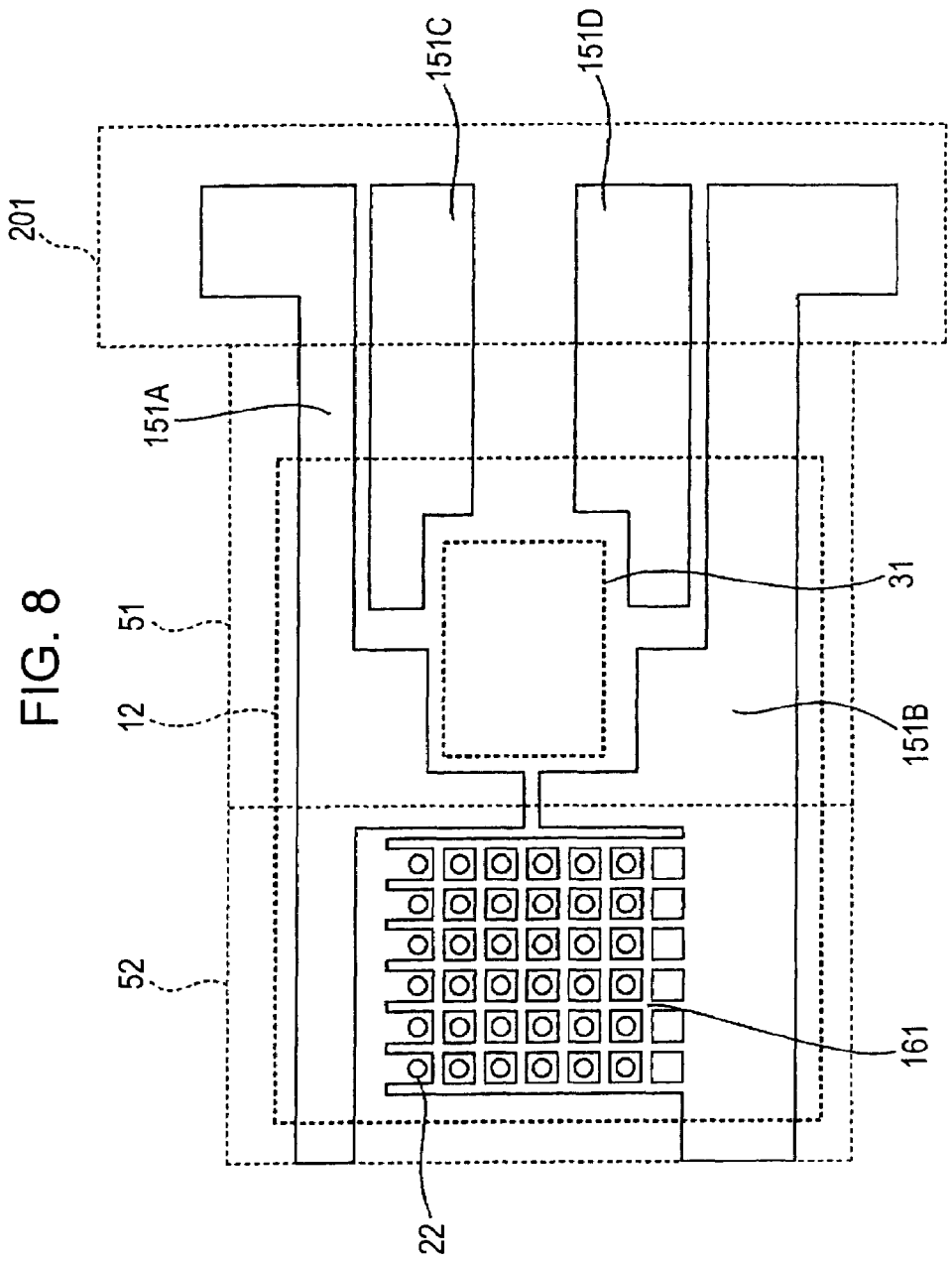
FIG. 8 is a plan view illustrating the relationship between metal thin films and a chip.
Figure 9:
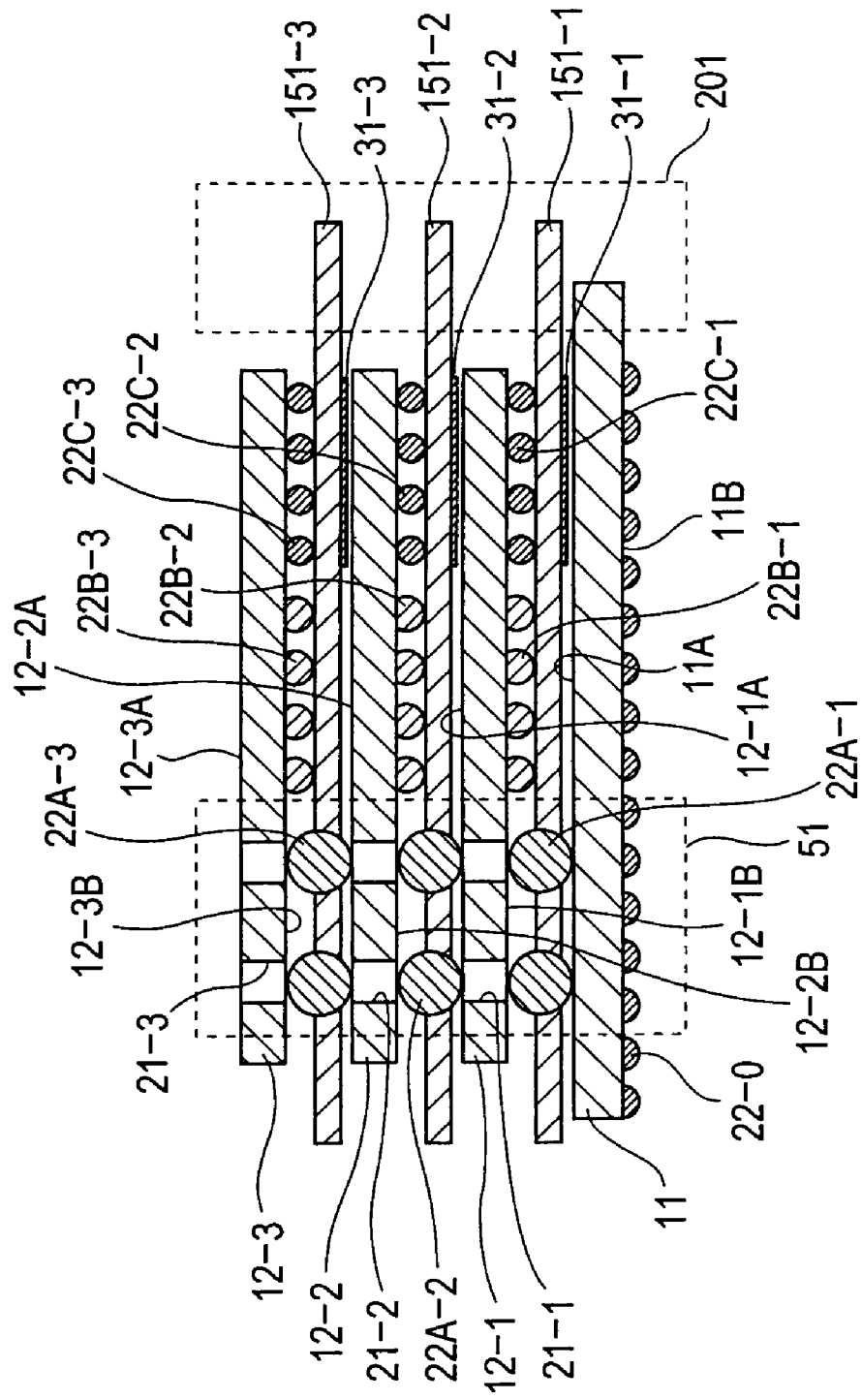
FIG. 9 is a sectional side view of a three-dimensional multi-chip, wherein metal thin films and interposers are assembled.

By disposing chips on metal thin films 151, the overall thickness of the semiconductor device is increased. To prevent this, it is also possible to dispose chips 31 so that the backs of the chips 31 do not contact the metal thin films 151, as illustrated in FIGS. 8 and 9. In this embodiment, as illustrated in FIG. 8, the metal thin films 151 are not disposed in the areas corresponding to the areas where the chips 31 are disposed.

In such a structure, the efficiency of heat conductivity is reduced compared to the structure shown in FIGS. 6 and 7. However, since the metal thin films 151 are disposed in the vicinity of the chips 31, part of the heat generated by the chips 31 is dissipated through the metal thin films 151.

Figure 10:
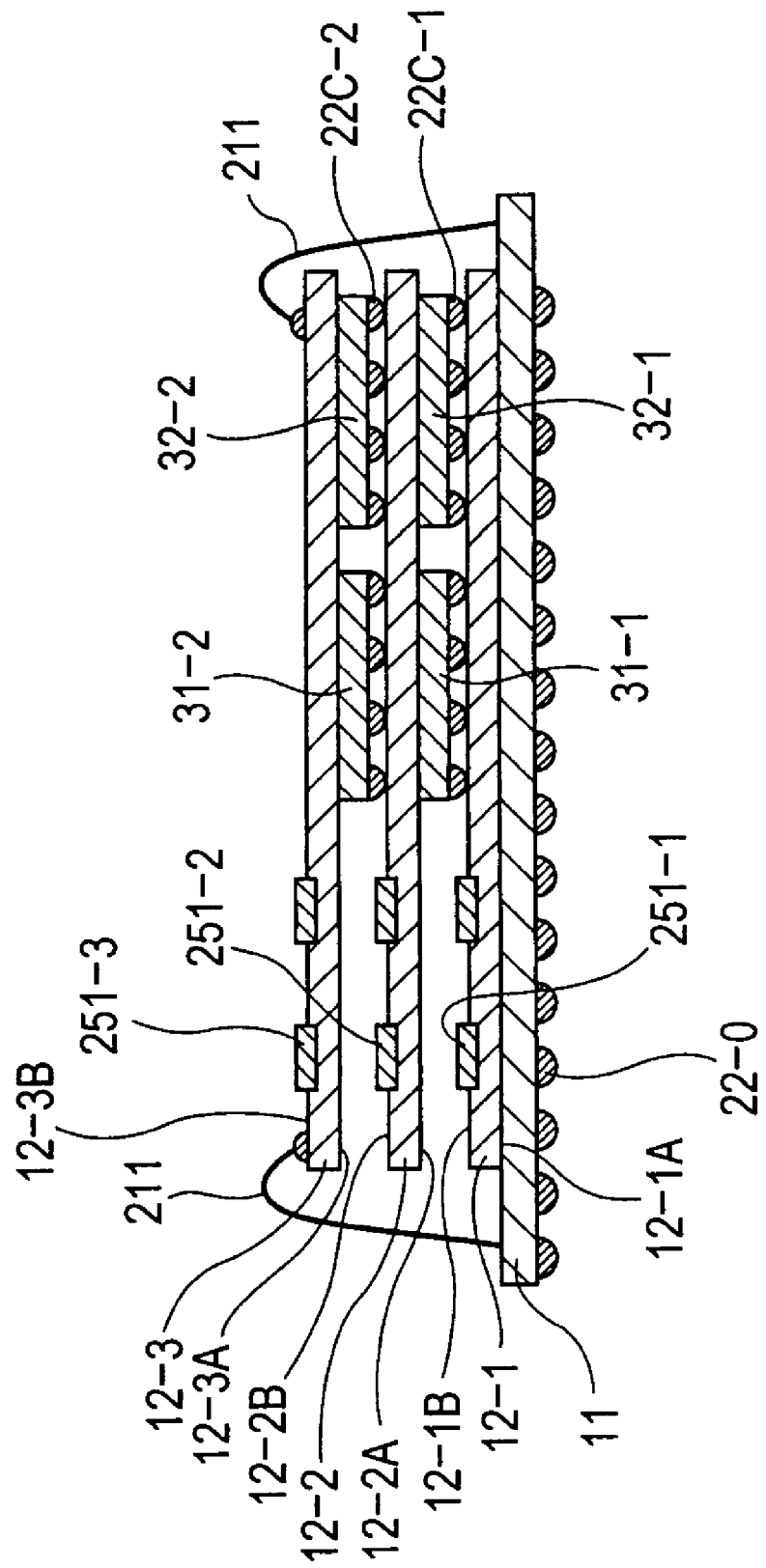
FIG. 10 is a sectional side view of a three-dimensional multi-chip, wherein antennas are formed on interposers.
Figure 11:
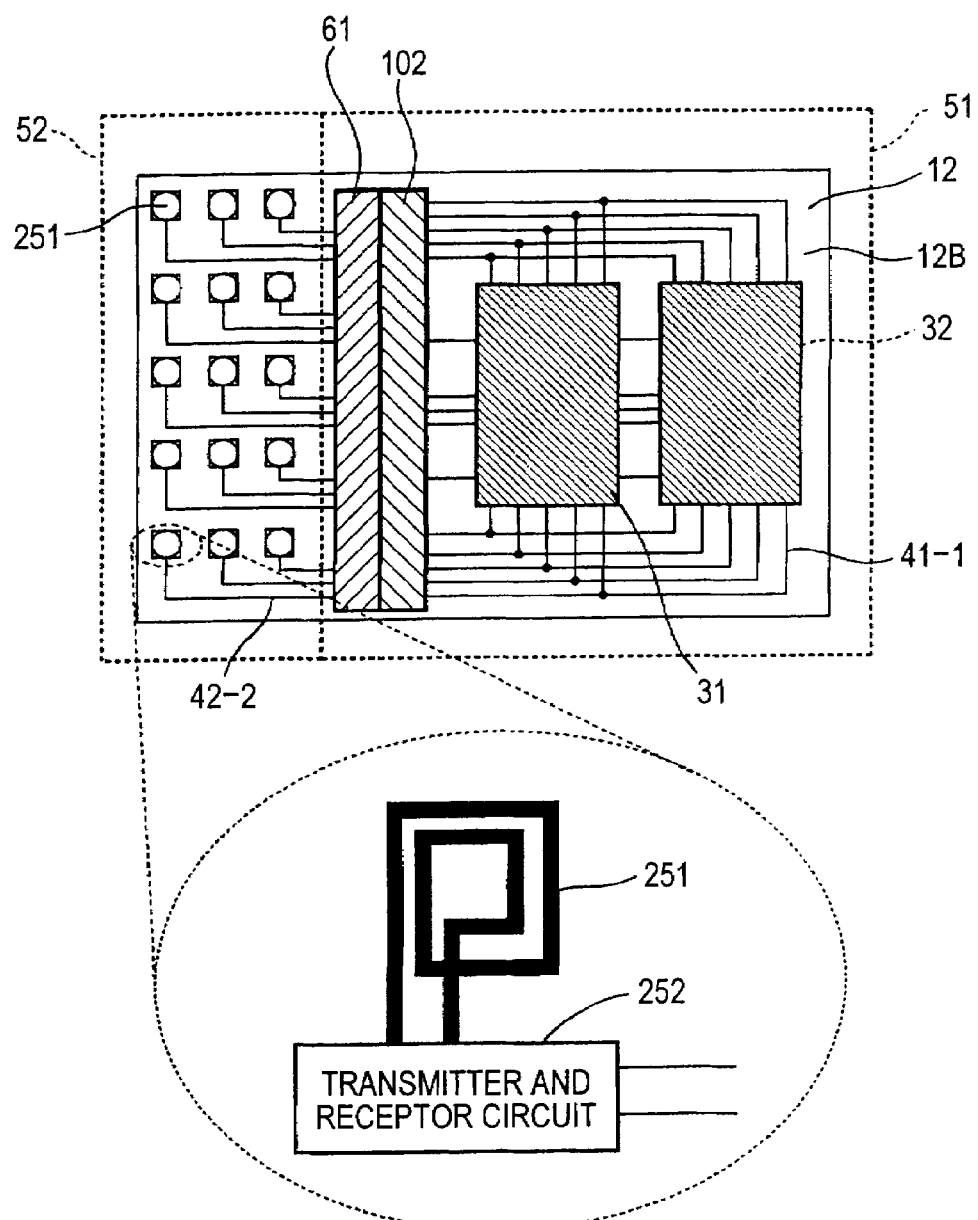
FIG. 11 is a plan view of the three-dimensional multi-chip illustrated in FIG. 10.

Silicon is often used to compose interposers 12. However, it is relatively difficult to form through-holes in interposers made of silicon, and thus, production cost is high. For this reason, for example, a cluster of antennas 251 functioning as communication units may be provided in areas 52, as illustrated in FIGS. 10 and 11, so that signals can be transmitted and received between interposers without forming through-holes. In this embodiment, as illustrated in FIG. 10, an interposer 12-1 is disposed on a substrate 11, an interposer 12-2 is disposed on the interposer 12-1, and finally an interposer 12-3 is disposed on the interposer 12-2. On a surface 12-1B of the interposer 12-1, bumps 22C-1 are provided, and, on the bumps 22C-1, chips 31-1 and 32-1 are disposed. Antennas 251-1 are also formed on the surface 12-1B of the interposer 12-1. On a surface 12-2B of the interposer 12-2 where chips 31-2 and 32-2 are disposed, antennas 251-2 are formed. On a surface 12-3B of the interposer 12-3, antennas 251-3 are formed. In this embodiment, chips are not disposed on the interposer 12-3.

Electrical power is supplied via a bonding wire 211 connected from the substrate 11 to the interposer 12-3. Although not shown in the drawings, electrical power is supplied to the surfaces 12-1B and 12-2B of the interposers 12-1 and 12-2, respectively, via bonding wires.

Each of the antennas 251, as illustrated in FIG. 11, is connected to a transmitter and receptor circuit 252. The antennas 251 are constituted of coiled wiring patterns disposed on the interposers 12. The transmitter and receptor circuits 252 are embedded in the interposers 12. The transmitter and receptor circuits 252 may be formed either in the regions 51 or the regions 52. The transmitter and receptor circuits 252 disposed on the same interposer 12 are controlled by a transmitter and receptor controller 102.

Figure 12:
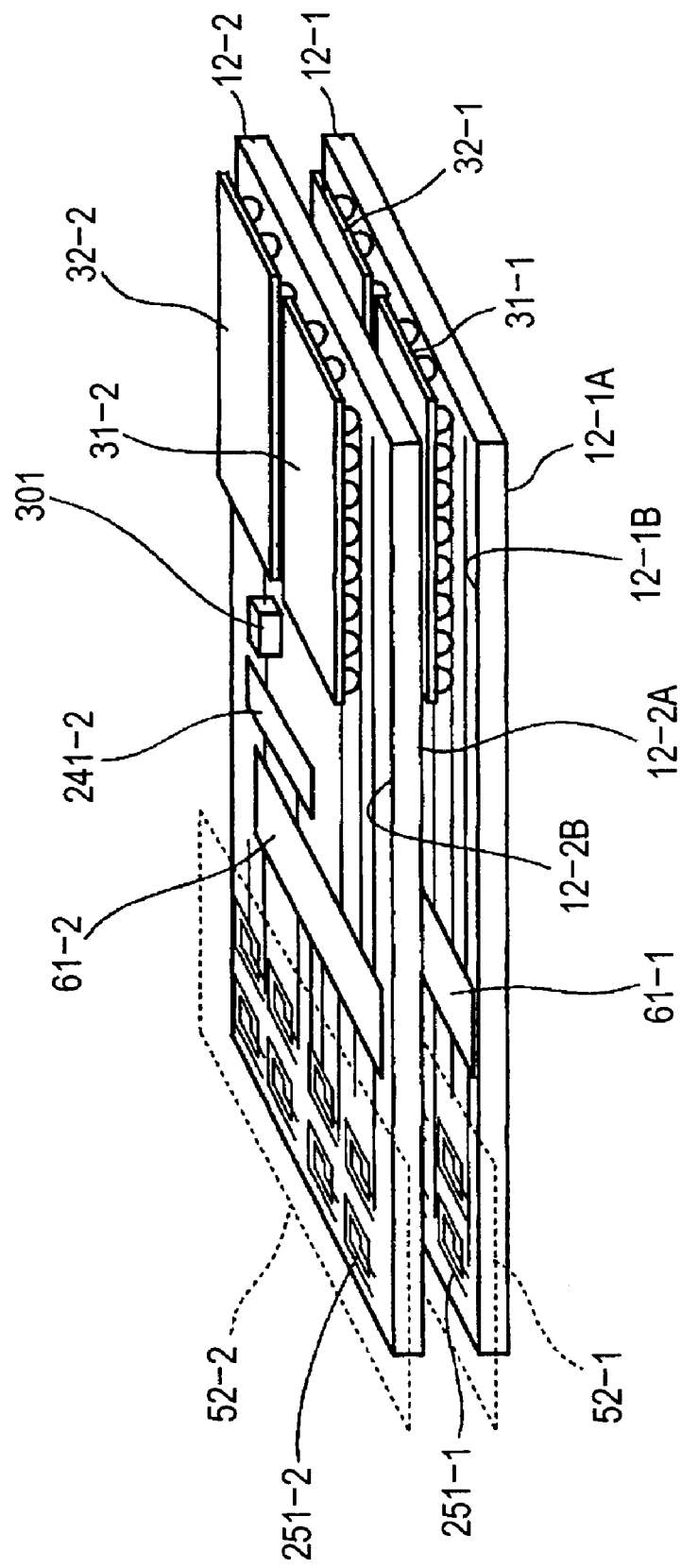
FIG. 12 is a perspective view of a three-dimensional multi-chip including antennas.

FIG. 12 illustrates a simplified view of a stack of interposers 12-1 and 12-2. In this embodiment, the surface 12-2B of the interposer 12-2 is connected to chips 31-2 and 32-2 via bumps. On the surface 12-2B, a receptor element 301, a transmitter and receptor controller 241-2, and a cross-bus switch 61-2 are disposed. In a region 52-2, a cluster of antennas 251-2 (a matrix of 2×4 antennas is shown in the drawing) is provided.

The interposer 12-1, disposed below the interposer 12-2, also has the same structure as that of the interposer 12-2.

Radio communication (electromagnetic induction) is carried out between the antennas 251-1 in the region 52-1 of the interposer 12-1 and antennas 251-2 in the region 52-2 of the interposer 12-2 at positions corresponding to the antennas 251-1.

Figure 13:
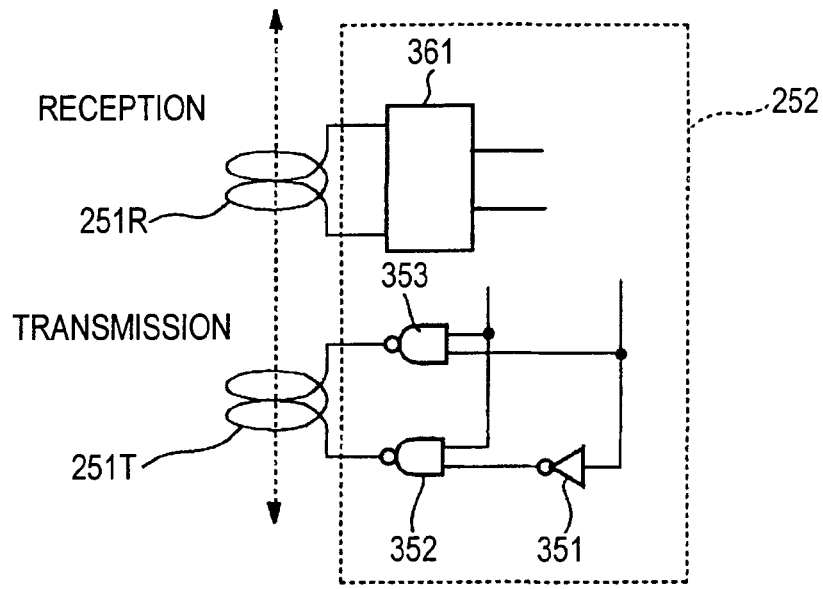
FIG. 13 illustrates transmission and reception of an antenna.

In other words, as illustrated in FIG. 13, each of the antennas 251 are constituted of a transmission antenna 251T and a reception antenna 251R. The ends of the transmission antenna 251T are connected to NAND circuits 352 and 353. An input terminal of the NAND circuit 352 and an input terminal of the NAND circuit 353 are connected and are further connected to a transmission and reception controller 241-2. The other input terminal of the NAND circuit 353 is directly connected to the transmission and reception controller 241-2, whereas the other input terminal of the NAND circuit 352 is connected to the other terminal of the NAND circuit 353 via an inverter 351.

When the transmission and reception controller 241-2 inputs a logical value 1 to one of the common input terminals of the NAND circuits 352 and 353 and a logical value 0 is input to the other input terminal of the NAND circuit 353, a logical value 1 is input to the other input terminal of the NAND circuit 352 via the inverter 351. Consequently, the outputs from the NAND circuit 353 and the NAND circuit 352 are logical values 1 and 0, respectively. As a result, an electrical current is applied to the antenna 251T from the NAND circuit 353 to the NAND circuit 352. This state corresponds to the logical value 1. On the contrary, when a logical value 0 is input to the common input terminal of the NAND circuits 352 and 353 and a logical value 1 is input to the other input terminal of the NAND circuit 353, a logical value 0 is input to the other input terminal of the NAND circuit 352 via the inverter 351. As a result, in this case, since the output of the NAND circuit 353 is a logical value 0 and the output of the NAND circuit 352 is a logical value 1, an electrical current is applied to the antenna 251T from the NAND circuit 352 to the NAND circuit 353. This state corresponds to the logical value 0.

When an electrical current is applied to the antenna 251T, as described above, a magnetic flux generated as a result of the electrical current is received by a reception antenna 251R of another interposer 12. When a change in the magnetic flux is detected by the antenna 251R, an electromotive force corresponding to the change is detected by a sensor amplifier 361 and output to a cross-bus switch 61-2.

As described above, signals are transmitted and received between different interposers by antennas disposed at corresponding positions.

Although not shown in the drawings, a three-dimensional multi-chip constituted of a stack of interposers, as described above, is molded by resin to produce a semiconductor device.

In this way, for example, SIPs and multi-chip modules (MCMs) are produced.

Figure 14:
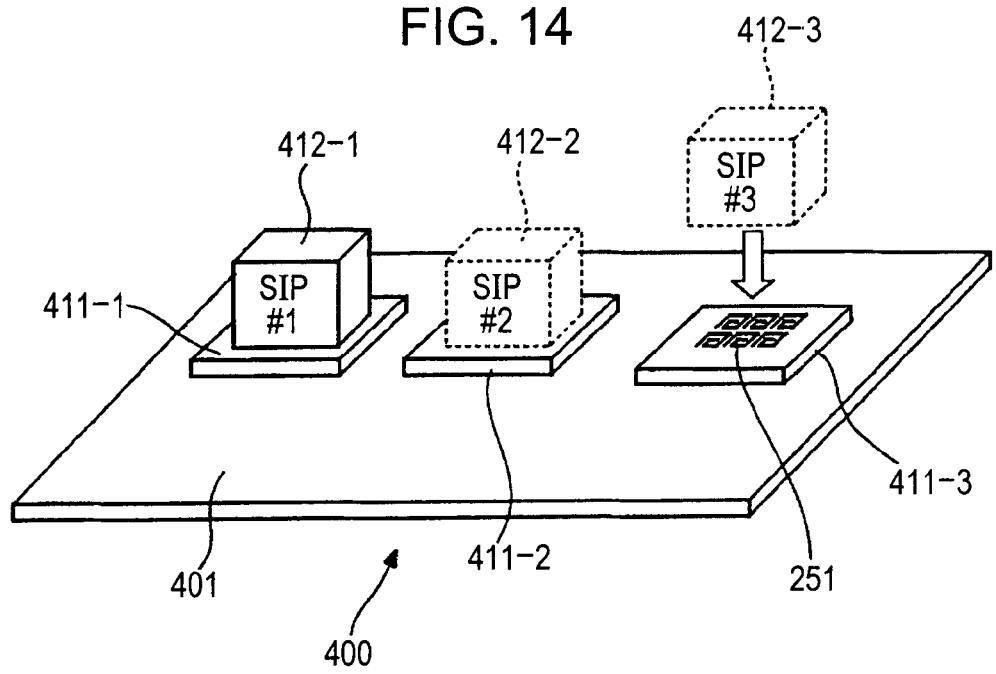
FIG. 14 is a perspective view of the structure of an equipment board.

FIG. 14 illustrates an equipment board 400 according to an embodiment of the present invention including SIPs produced as described above. The equipment board 400 is constituted of a substrate 401 where wireless interface substrates 411-1 to 411-3 are disposed at predetermined positions. Each of the wireless interface substrates 411-1 to 411-3 includes a plurality of antennas 251. SIPs 412-1 to 412-3 are mounted on the wireless interface substrates 411-1 to 411-3, respectively. Antennas 251 are also provided on a substrate closest to the surfaces of the SIPs 412-1 to 412-3 connected to the wireless interface substrates 411-1 to 411-3 at corresponding positions. In this way, the SIPs 412-1 to 412-3 can be easily produced by disposing and bonding SIPs 412-1 to 412-3 at predetermined positions on the wireless interface substrates 411-1 to 411-3 since communication is carried out between corresponding antennas.

Various electronic components are embedded in the equipment board 400 produced as described above.

Figure 18:
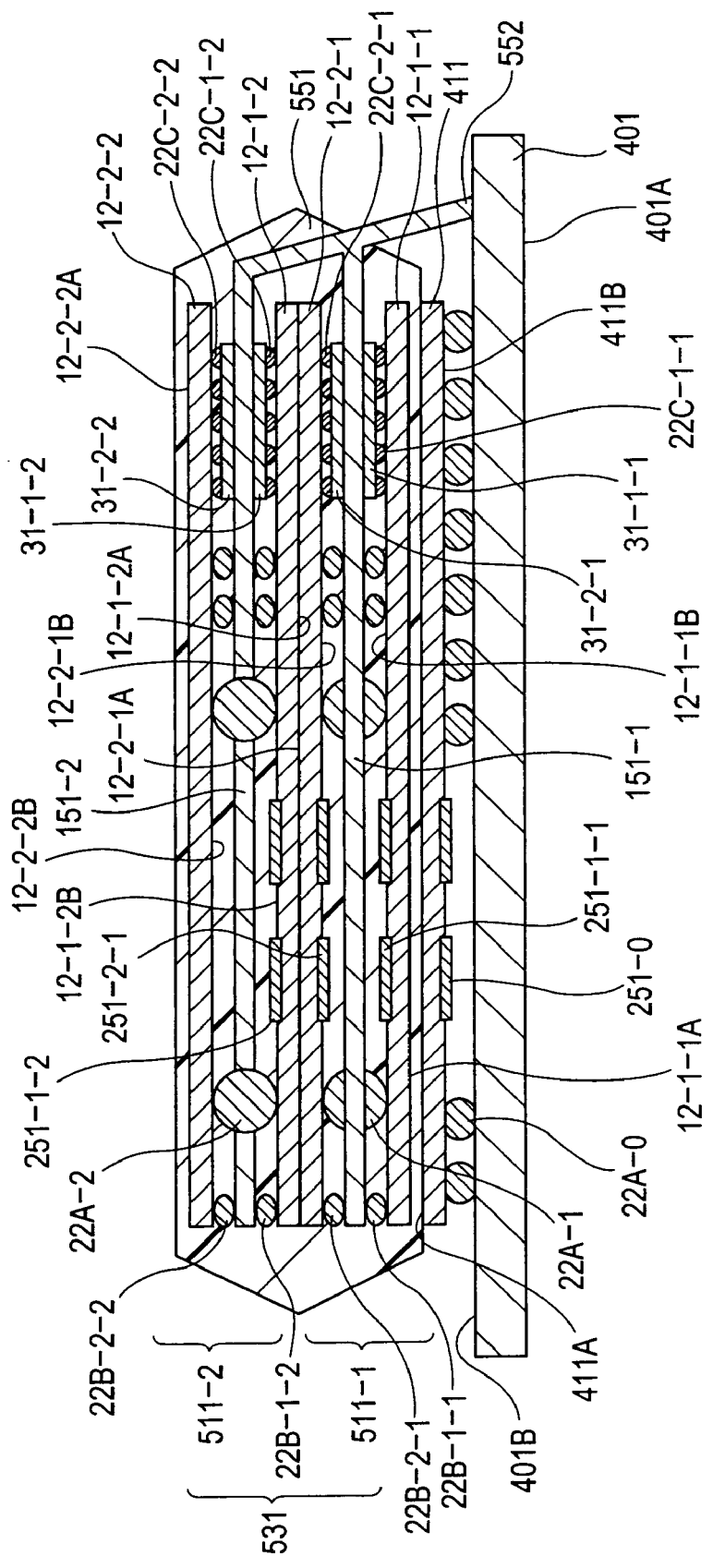
FIG. 18 is a sectional side view of a semiconductor device produced by the method illustrated in FIG. 15.

Next, a method for producing an equipment board will be described with reference to the flow chart shown in FIG. 15. The equipment board having SIPs, illustrated in FIGS. 16 to 18, is produced by this method.

In Step S1, a pattern including an antenna is formed on an interposer. For example, as illustrated in FIG. 16, a wiring pattern including antennas 251 are formed on a surface 12B of an interposer 12. Each of the antennas 251 includes a transmitter and receptor circuit 252. Also, a cross-bus switch 61 and a transmission and reception controller 102 are formed.

In Step S2, bumps and chips are disposed at predetermined positions. As illustrated in FIG. 16, a chip 31 is connected to a predetermined wiring pattern on the surface 12B of the interposer 12 via bumps 22C. Bumps 22B for bonding a metal thin film 151 are disposed at predetermined positions on the surface 12B. In this way, a two-dimensional multi-chip 501 is produced.

A plurality of two-dimensional multi-chips 501 is formed by carrying out the same process.

Next, in Step S3, two two-dimensional multi-chips 501 are put together with the metal thin film 151 so that the surfaces having the chips 31 of the two-dimensional multi-chips 501 oppose each other. In other words, as illustrated in FIG. 17, on an interposer 12-1 connected with a chip 31-1 via bumps 22C-1 is connected to a metal thin film 151 via bumps 22B-1. An interposer 12-2 connected to a chip 31-2 via bumps 22C-2 is connected to the metal thin film 151 via bumps 22B-2. The back sides of the chips 31-1 and 31-2 are in contact with the metal thin film 151. The interposers 12-1 and 12-2 are put together so that surfaces 12-1B and 12-2B having the chips 31-1 and 31-2 oppose each other. Then, predetermined wiring patterns are connected to the interposers 12-1 and 12-2 via bumps 22A, which have larger diameters than those of the bumps 22B. In this way, a three-dimensional multi-chip 511 is produced.

As described above, a plurality of three-dimensional multi-chips 511, which are produced by putting together two two-dimensional multi-chips 501, is produced.

Next, in Step S4, at least two three-dimensional multi-chips 511 are put together so that the positions of the antennas correspond to each other. Then, in Step S5, an external power-supply terminal is connected and molded to the metal thin film. FIG. 18 illustrates an exemplary structure of a SIP, which is a semiconductor device, produced as described above. According to this structure, a three-dimensional multi-chip 511-1 constituted of an assembly of interposers 12-1-1 and 12-2-1 and a three-dimensional multi-chip 511-2 constituted of an assembly of interposers 12-1-2 and 12-2-2 are put together and molded by a resin 551 to produce a semiconductor device 531 (SIP 412).

A chip 31-1-1 is connected to a surface 12-1-1B of the interposer 12-1-1 via bumps 22C-1-1. The back side of the chip 31-1-1 is in contact with a metal thin film 151-1. The metal thin film 151-1 is connected to the surface 12-1-1B of the interposer 12-1-1 via bumps 22B-1-1.

A chip 31-2-1 is connected to a surface 12-2-1B of an interposer 12-2-1 via bumps 22C-2-1. The back side of the chip 31-2-1 is in contact with a metal thin film 151-1. The metal thin film 151-1 is connected to the interposer 12-2-1 via bumps 22B-2-1. Predetermined wiring patterns of the interposer 12-1-1 and the predetermined wiring patterns of the interposer 12-2-1 are connected via bumps 22A-1.

A chip 31-1-2 is connected to a surface 12-1-2B of an interposer 12-1-2 via bumps 22C-1-2. The back side of the chip 31-1-2 is connected to a metal thin film 151-2. The metal thin film 151-2 is connected to the interposer 12-1-2 via bumps 22B-1-2. A chip 31-2-2 is connected to an interposer 12-2-2 via bumps 22C-2-2. The back side of the chip 31-2-2 is connected to the metal thin film 151-2. The metal thin film 151-2 is connected to the interposer 12-2-2 via bumps 22B-2-2. Predetermined wiring patterns of the interposer 12-1-2 and the predetermined wiring patterns of the interposer 12-2-2 are connected via bumps 22A-2.

The interposers 12-1-1 and 12-2-1 are put together so that the surfaces 12-1-1B and 12-2-1B connected to the chips 31-1-1 and 31-2-1, respectively, oppose each other. Similarly, the interposers 12-1-2 and 12-2-2 are put together so that the surfaces 12-2-1B and 12-2-2B connected to the chips 31-1-2 and 31-2-2, respectively, oppose each other.

As a result, when the three-dimensional multi-chips 511-1 and 511-2 are put together, the antenna 251-2-1 formed on the interposer 12-2-1 and the antenna 251-1-2 formed on the interposer 12-1-2 are separated by distances corresponding to the interposers 12-2-1 and 12-1-2, respectively. As a result, for example, the distance between the antennas 251-2-1 and 251-1-2 can be decreases compared to when surfaces 12-1B and 12-2B including chips are stacked facing the same direction (upward in FIG. 12), as illustrated in FIG. 12. Thus, reliable communication between the antennas can be established.

The metal thin films 151-1 and 151-2 are connected to each other and are connected to an external power-supply terminal 552 lead out from the resin 551.

In Step 6, a wireless interface substrate is disposed on the substrate of the equipment board. More specifically, as illustrated in FIG. 14, wireless interface substrates 411-1 to 411-3 are disposed on a substrate 401. Even more specifically, as illustrated in FIG. 18, a wireless interface substrate 411 is connected to a surface 401B of a substrate 411 via bumps 22A-0. An antenna 251-0 is formed on a surface 411B of the wireless interface substrate 411. A semiconductor device molded by the resin 511 is bonded onto the wireless interface substrate 411 so that the antenna 251-0 opposes an antenna 251-1-1 disposed on the interposer 12-1-1, which is the outermost interposer on the side of the wireless interface substrate 411 among the interposers molded by the resin 511.

In Step S8, an external power-supply terminal is connected to a substrate on the equipment board. More specifically, the external power-supply terminal 552 is connected to a predetermined power-supply pattern on the substrate 401. As a result, electrical power supplied to the substrate 401 is supplied from the external power-supply terminal 552 to the metal thin layers 151-1 and 151-2 via the pattern on the substrate 401. Then, the electrical power supplied to the metal thin layer 151-1 is supplied to the power-supply pattern of the interposer 12-1-1 via the bumps 22B-1-1 and is further supplied to the chip 31-1-1 via the bumps 22C-1-1. The electrical power supplied to the metal thin layer 151-1 is also supplied to the power-supply pattern of the interposer 12-2-1 via the bumps 22B-2-1 and is further supplied to the chip 31-2-1 via the bumps 22C-2-1.

Electrical power is also supplied to the chips 31-1-2 and 31-2-2 mounted on the interposers 12-1-2 and 12-2-2, respectively.

The bumps 22A connected to the antennas 251 are capable of individually leading an input to or an output from a predetermined terminal of a chip on an interposer. For example, an output from a predetermined output terminal of the chip 31-1-1 on the interposer 12-1-1 is supplied to the corresponding wiring pattern on the interposer 12-1-1 via the bump 22C-1-1 connected to the output terminal. Then, the output is radio-transmitted from the antenna 251-1-1 to the antenna 251-0 on the wireless interface substrate 411. Then, the output is sent from the wiring pattern connected to the antenna 251-0 on the wireless interface substrate 411 to a wiring pattern on the substrate 401 via the bumps 22A-0.

On the other hand, when a signal is input from outside to a predetermined input terminal of the chip 31-1-1, the signal is supplied from a predetermined pattern on the substrate 401 to a wiring pattern on the wireless interface substrate 411 via the bumps 22A-0. The signal is supplied to the antenna 251-0 connected to the wiring pattern via the wiring pattern. The signal is radio-transmitted to the corresponding antenna 251-1-1. Then, the signal is supplied from the bumps 22C-1-1 to the input terminal of the chip 31-1-1 connected to the bumps 22C-1-1 via the wiring pattern of the interposer 12-1-1.

To receive the signal, antennas, bumps, wiring patterns are reserved to form an exclusive channel.

Similarly, when a signal is lead outside from a predetermined output terminal of the chip 31-2-2 connected to the interposer 12-2-2 via the bumps 22C-2-2, the signal is transmitted, in order, through the bumps 22C-2-2 connected to the output terminal, the wiring pattern of the interposer 12-2-2, the bumps 22A-2, the wiring pattern of the interposer 12-1-2, the antenna 251-1-2 of the interposer 12-1-2, the antenna 251-2 of the interposer 12-2-1, the wiring pattern of the interposer 12-2-1, the bumps 22A-1, the wiring pattern of the interposer 12-1-1, the antenna 251-1-1 of the interposer 12-1-1, the antenna 251-0 on the wireless interface substrate 411, the wiring pattern on the wireless interface substrate 411, the bumps 22A-0, and finally the wiring pattern on the substrate 401 of the equipment board 400.

Bumps, wiring patterns, and antennas are reserved to form an exclusive channel for transmitting signals. Although detailed descriptions are omitted here, similarly antennas, wiring patterns, and bumps are reserved to form an exclusive channel for inputting a signal to an input terminal of the chip 31-2-2.

The above-described Steps S1 to S8 constitutes a process of producing an equipment board. Steps S1 to S5 also constitute a process of producing a semiconductor device.

Figure 19:
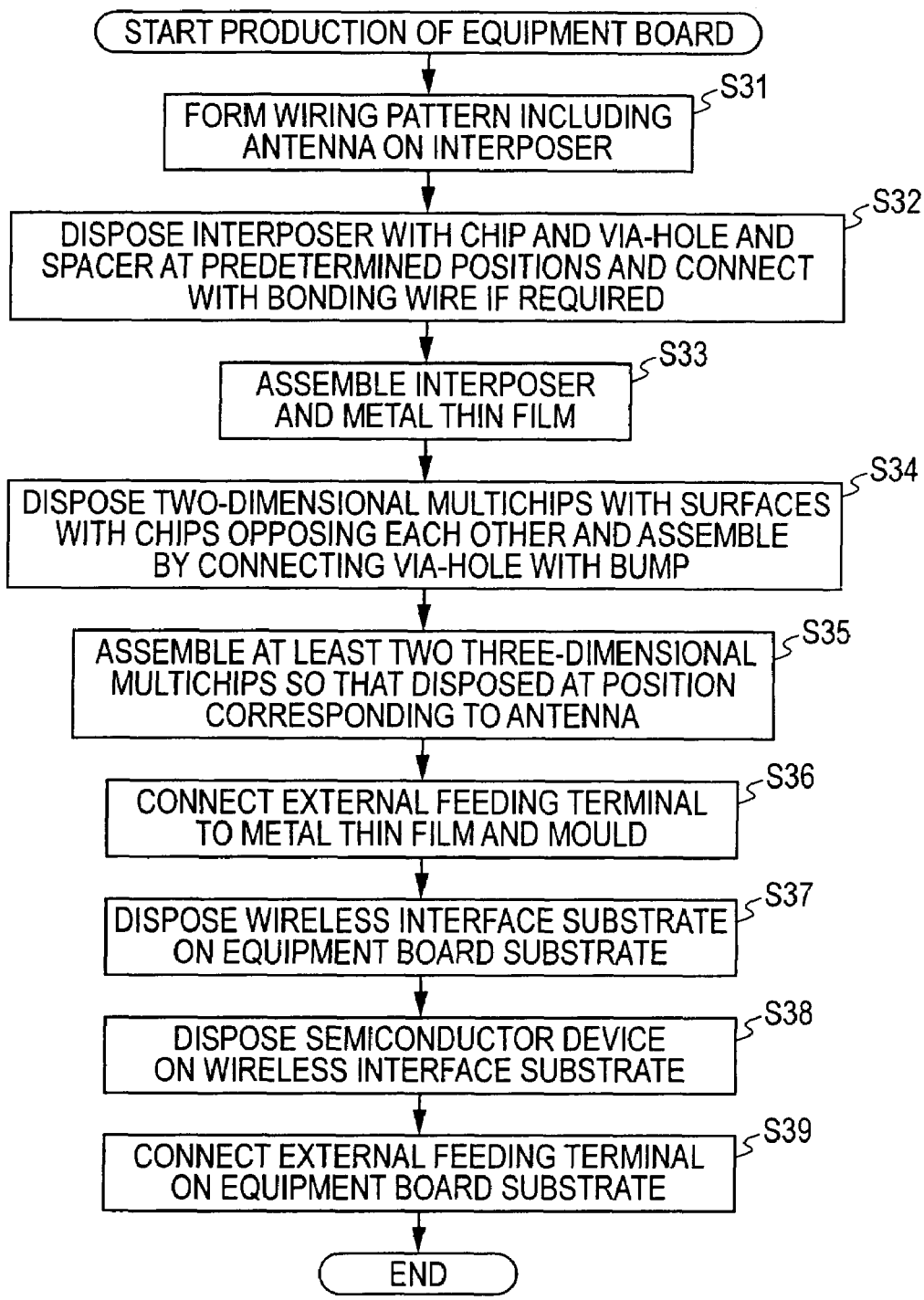
FIG. 19 is a flow chart illustrating a method for producing an equipment board.

Since the semiconductor device illustrated in FIGS. 16 to 18 uses many bumps, the thickness of the device can be reduced but production costs are increased compared to the production costs of a semiconductor device using bonding wires. Now, a method for producing an equipment board using a semiconductor device whose production costs is reduced by using bonding wires in some parts will be described with reference to the flow chart shown in FIG. 19.

Figure 20:
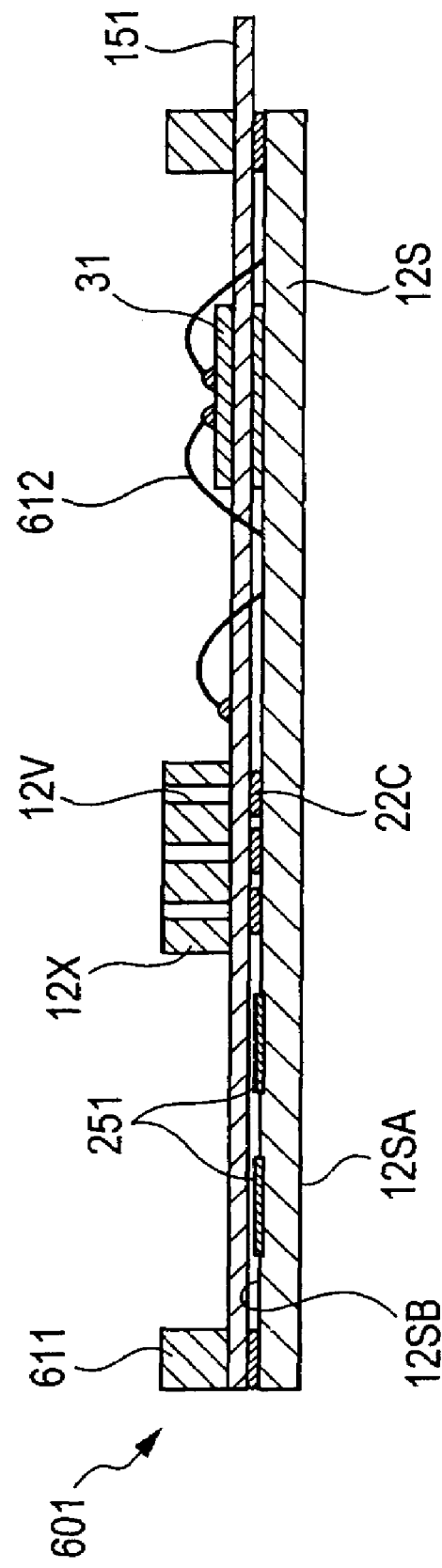
FIG. 20 is a sectional side view of a two-dimensional multi-chip produced by the method illustrated in FIG. 19.
Figure 21:
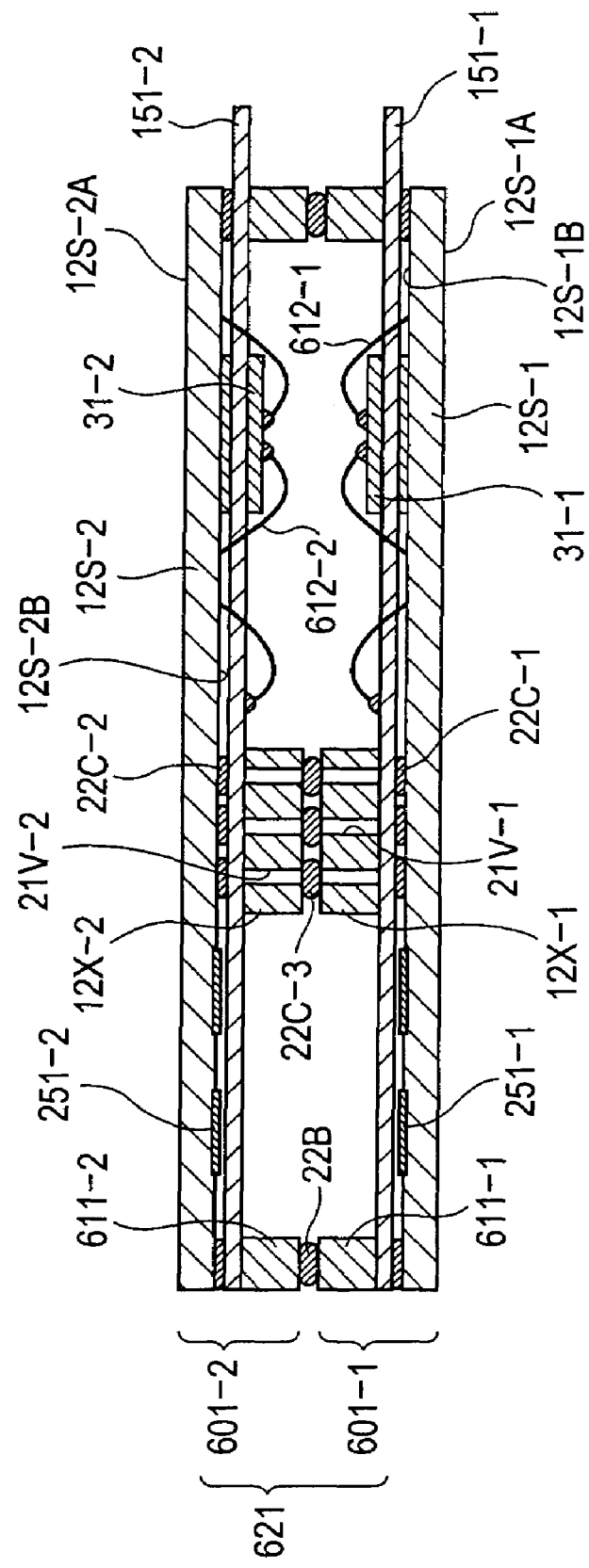
FIG. 21 is a sectional side view of a three-dimensional multi-chip produced by the method illustrated in FIG. 19.
Figure 22:
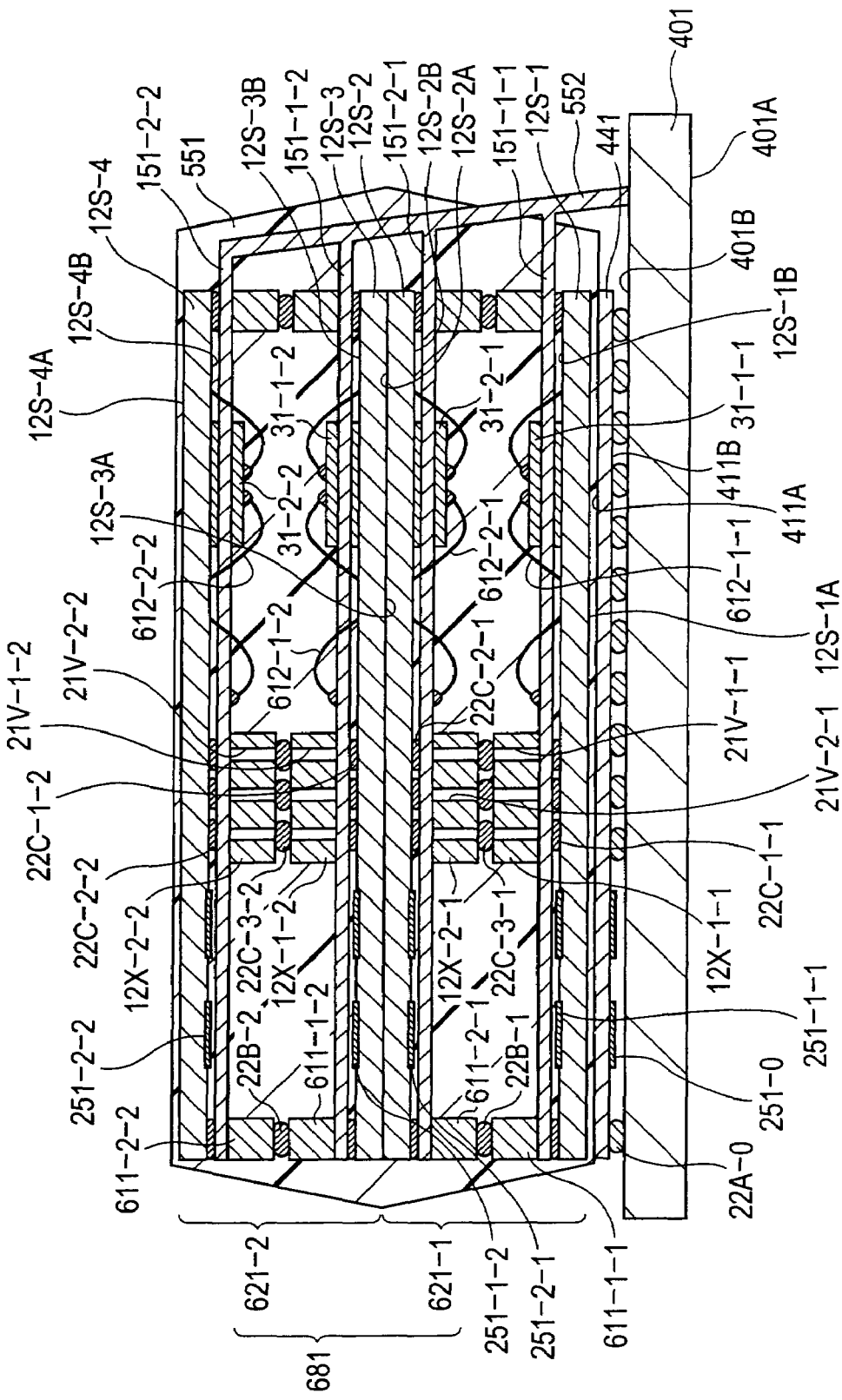
FIG. 22 is a sectional side view of a semiconductor device produced by the method illustrated in FIG. 19.

The semiconductor device produced in this process has the same structure as that illustrated in FIGS. 20 to 22.

In Step S31, a pattern including an antenna is formed on an interposer. In Step S32, a chip, an interposer having via-holes, and spacers are provided at predetermined positions, and, then, predetermined positions are connected with bonding wires. In Step S33, the interposer and a metal thin layer are put together. In this way, as illustrated in FIG. 20, antennas 251 and wiring patterns are formed on an interposer 12S. The interposer 12S may be composed of silicon. In this way, stable characteristics can be obtained.

On a surface 12SB of the interposer 12S, a chip 31 is disposed. The chip 31 may be embedded into the interposer 12S in advance. Predetermined terminals of the chip 31 are connected to predetermined wiring patterns on the interposer 12S via bonding wires 612. Another interposer 12X is prepared. The interposer 12X is composed of a material other than silicon in which through-holes can be easily formed. For example, the interposer 12X may be composed of glass epoxy resin, polyimide resin, or phenolic resin.

The interposer 12X having via-holes 21V, which are a type of through-holes, is connected to the interposer 12S via bumps 22C. The interposer 12S is put together with a metal thin film 151. The metal thin film 151 is connected to a predetermined power-supply wiring pattern on the interposer 12S via the bonding wires 612. Spacers 611 are disposed at the periphery of the interposer 12S. In this way, a two-dimensional multi-chip 601 is produced.

In Step S34, two two-dimensional multi-chips are put together by opposing the surfaces having the chips and connecting the via-holes via bumps. In this way, as illustrated in FIG. 21, a three-dimensional multi-chip 621 is produced. The three-dimensional multi-chip 621 is produced by putting together two-dimensional multi-chips 601-1 and 601-2. In the two-dimensional multi-chip 601-1, a chip 31-1 is mounted on a surface 12S-1B of an interposer 12S-1 and terminals of the chip 31-1 are connected to predetermined wiring patterns on the surface 12S-1B via bonding wires 612-1. The predetermined wiring patterns on the surface 12S-1B are connected via-holes 21V-1 on an interposer 12X-1 via bumps 22C-1. Antennas 251-1 are formed on the surface 12S-1B of the interposer 12S-1. At the periphery of the interposer 12S-1, spacers 611-1 are disposed and the interposer 12S-1 is put together with a metal thin film 151-1.

The two-dimensional multi-chip 601-2 includes an interposer 12S-2. A chip 31-2 is disposed on a surface 12S-2B of the interposer 12S-2. Predetermined terminals of the chip 32-2 are connected to wiring patterns on the surface 12S-2B via bonding wires 612-2. Antennas are formed at predetermined positions on the surface 12S-2B via bonding wires 612-2. Predetermined wiring patterns on the surface 12S-2B are connected to via-holes 21V-2 of an interposer 12X-2 via bumps 22C-2. The interposer 12S-2 is put together with a metal thin film 152-2. Spacers 611-2 are disposed at the periphery of the interposer 12S-2. The spacers 611-2 and 611-2 are connected by bumps 22B. The via-holes 21V-1 of the interposer 12X-1 and the via-holes 21V-2 of the interposer 12X-2 are connected via bumps 22C-2.

In Step S35, at least two three-dimensional multi-chips are put together so that the antennas correspond to each other. In Step S36, an external power-supply terminal is connected to the metal thin films and molded. In other words, the metal thin films 151-1-1 to 151-2-2 are connected to each other and then connected to an external power-supply terminal 552. In this way, a semiconductor 681 (SIP 412) is produced, as illustrated in FIG. 22.

The semiconductor 681 is produced by putting together three-dimensional multi-chips 621-1 and 621-2 and molding these with a resin 551.

In this case too, the distance between an antenna 251-2-1 of the interposer 12S-2 of the three-dimensional multi-chip 621-1 and antennas 251-1-2 of an interposer 12S-3 of the three-dimensional multi-chip 621-1 is determined by the thickness of the interposers 12S-2 and 12S-3. Thus, the thickness of the semiconductor can be reduced compared to the thickness of a semiconductor produced by stacking a plurality of the two-dimensional multi-chips 601, as illustrated in FIG. 20, in such a manner that their surfaces 12SB face the same direction. As a result, reliable communication between the antennas is possible.

After the semiconductor device 681 is produced by the process of producing a semiconductor device according to Steps S31 to S36, in Step S37, a wireless interface substrate is disposed on a substrate of an equipment board. In Step S38, the semiconductor device is disposed on the wireless interface substrate. In Step S39, an external power-supply terminal is connected to the substrate of the equipment board.

Figure 15:
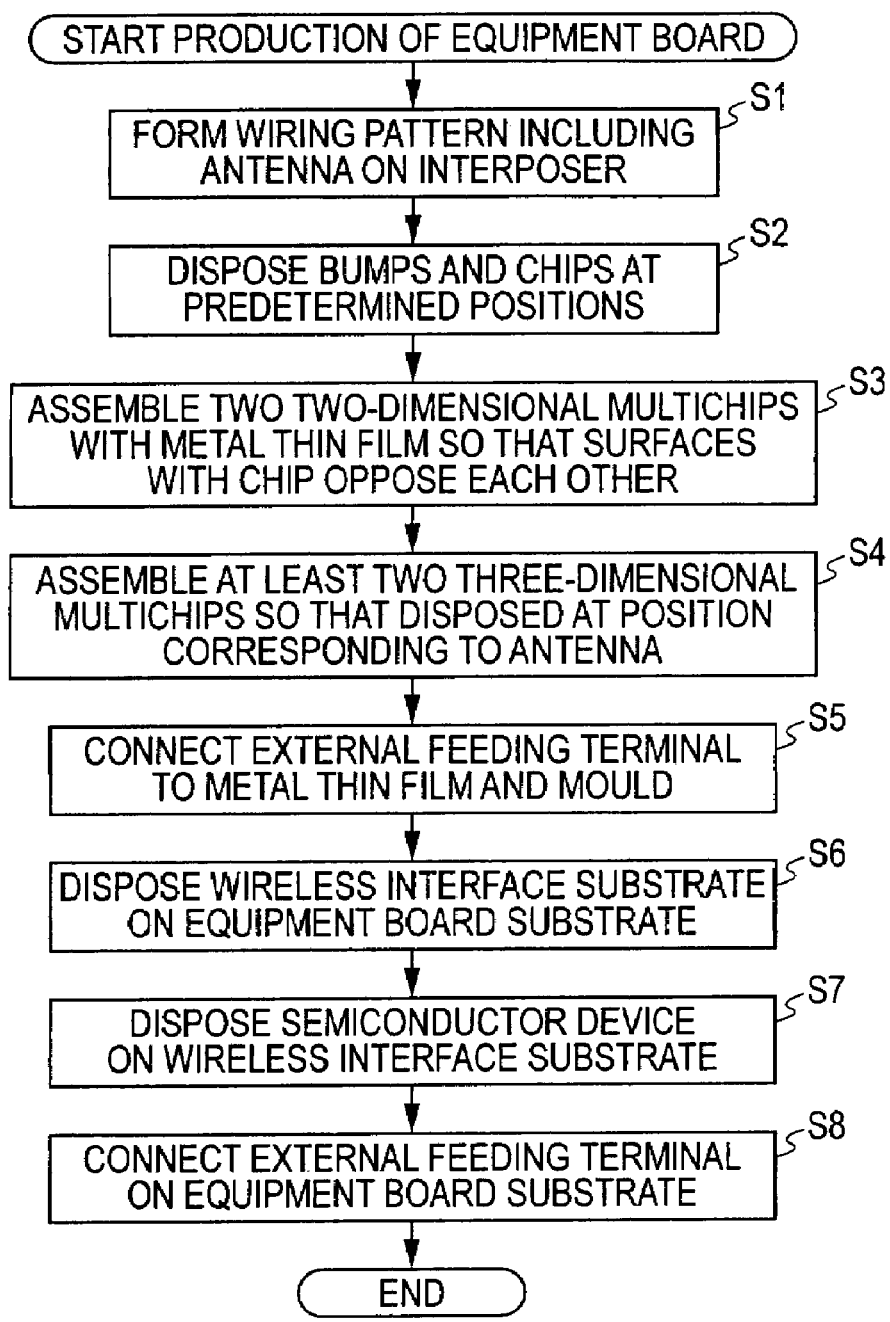
FIG. 15 is a flow chart illustrating a method for producing an equipment board.

Since the process from Steps S37 to S39 is the same as that of Steps S6 to S8 of the flow chart shown in FIG. 15, descriptions are omitted.

In the semiconductor device 681, for example, electrical power is supplied to a chip 31-2-2, in order, from a predetermined power-supply pattern in a substrate 401, an external power-supply terminal 552, a metal thin film 151-2-2, bonding wires 612-2-2, a predetermined wiring pattern on an interposer 12S-4, the bonding wires 612-2-2, and finally the power-supply terminal of the chip 31-2-2.

For example, the reception channel between the terminal of the chip 31-2-2 and the outside is constituted of a path formed, in order, from a terminal of the chip 31-2-2 to the bonding wires 612-2-2, wiring patterns of the interposer 12S-4, the bumps 22C-2-2, via-holes 21V-2-2 of an interposer 12X-2-2, bumps 22C-3-2, via-holes 21V-1-2 of an interposer 12X-1-2, bumps 22C-1-2, wiring patterns of the interposer 12S-3, the antennas 251-1-2, the antennas 251-2-1, wiring patterns of the interposer 12S-2, bumps 22C-2-1, via-holes 21V-2-1 of an interposer 12X-2-1, bumps 22C-3-1, via-holes 21V-1-1 of an interposer 12X-1-1, bumps 22C-1-1, wiring patterns of the interposer 12S-1, antennas 251-1-1, and antennas 251-0, wiring patterns of a wireless interface substrate 411, bumps 22A-0, and finally to wiring pattern of the substrate 401.

In the embodiments, the sequence of carrying out the steps in the process is not limited. The steps may be carried out time-sequentially, simultaneously, or each step may be carried out individually.

Figure 23:
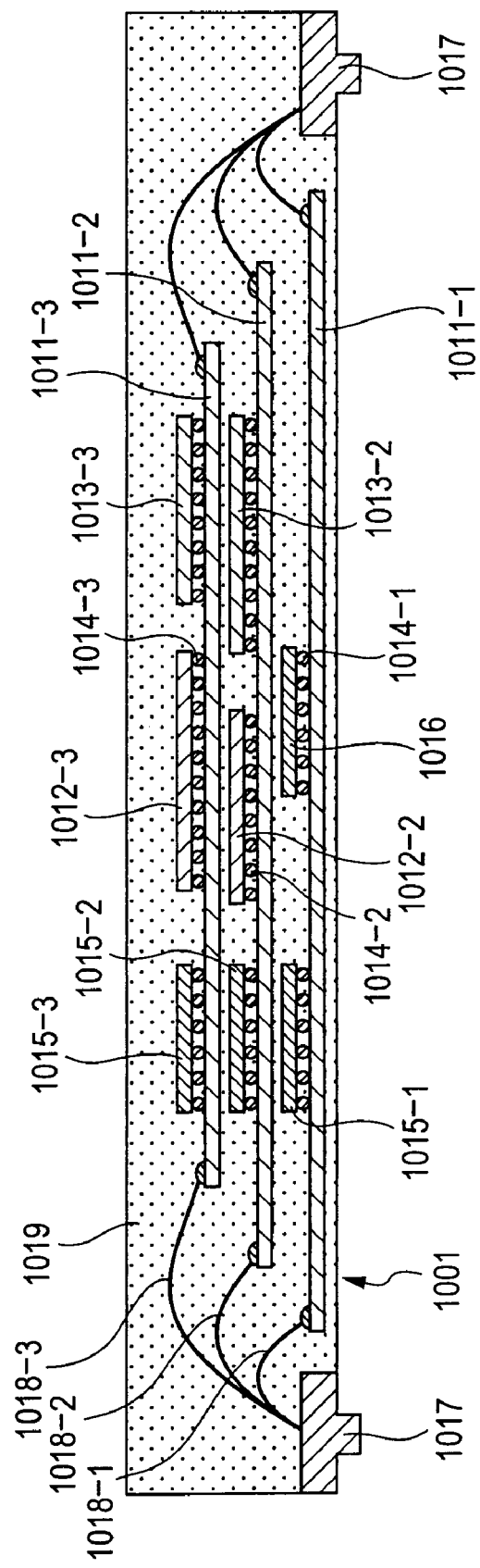
FIG. 23 is a sectional side view of a multi-chip package according to an embodiment of the present invention.
Figure 24:
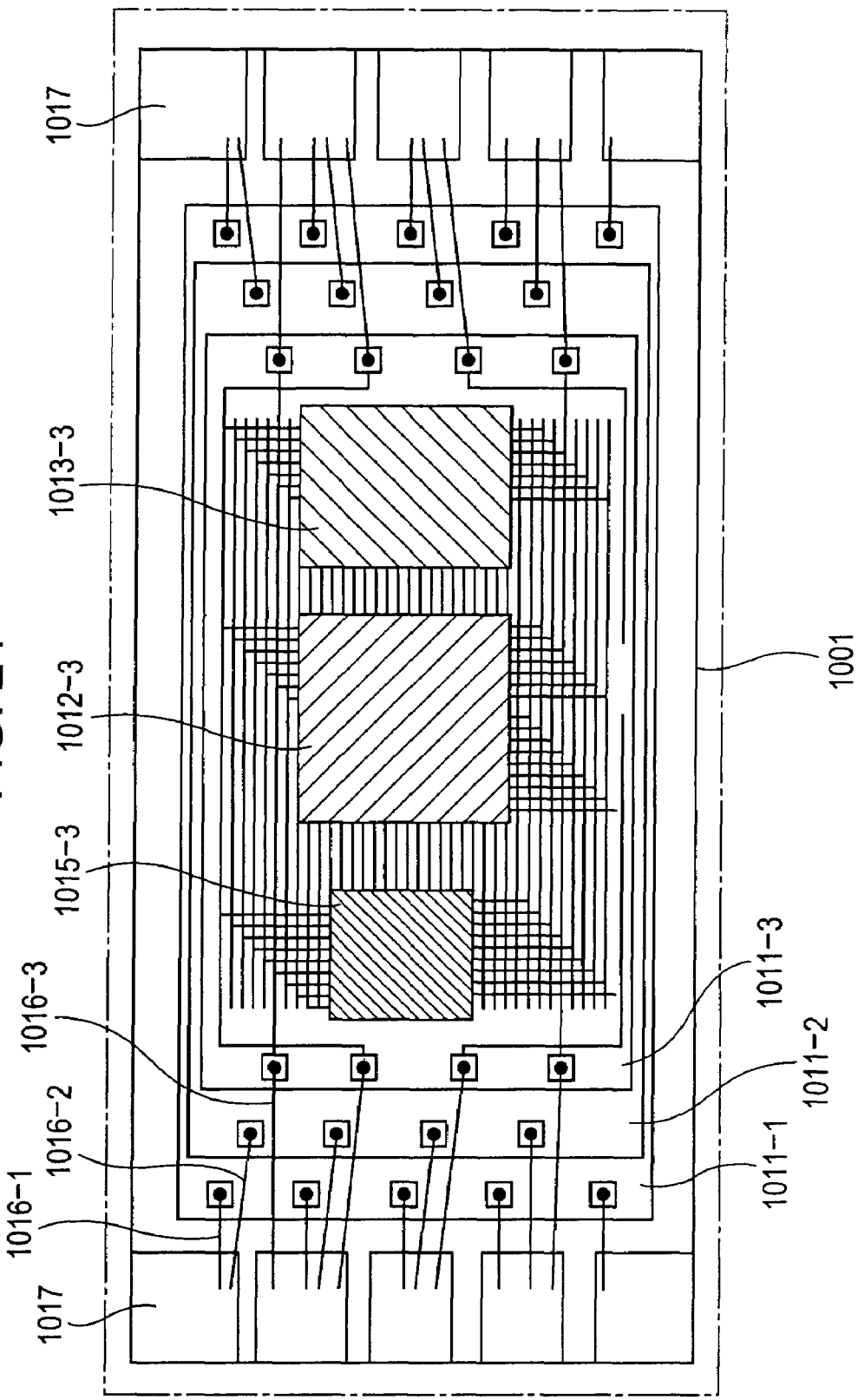
FIG. 24 is a plan view of the multi-chip package illustrated in FIG. 23.

As described above, antennas are formed on interposers, which are substrates. However, the antennas may be formed on semiconductor chips, and then these semiconductor chips may be disposed on the interposers so that communication between the interposers is established. FIGS. 23 and 24 illustrate semiconductor devices having such a structure.

A multi-chip package 1001 functioning as a semiconductor device includes three interposers 1011-1, 1011-2, and 1011-3 composed of silicon. On the lowermost interposer 1011-1, a communication chip 1015-1 and a communication chip 1016, which are semiconductor chips for communication, are connected via bumps 1014-1. Although not shown in the drawings, the communication chip 1015-1 and the communication chip 1016 are capable of receiving signals by wiring patterns formed on the interposer 1011-1. The interposer 1011-1 receives necessary electrical power from a power supply 1017 via a bonding wire 1018-1.

The interposer 1011-2 is connected to a communication chip 1015-2 and function chips 1012-2 and 1013-2 via bumps 1014-2. Signals can be transmitted to and received from each of the communication chip 1015-2 and the function chips 1012-2 and 1013-2 by using wiring patterns formed on the interposer 1011-2. The required electrical power is supplied to the interposer 1011-2 from the power supply 1017 via a bonding wire 1018-2.

The interposer 1011-3 is connected to a communication chip 1015-3 and function chips 1012-3 and 1013-3 via bumps 1014-3. Signals can be transmitted to and received from each of the communication chip 1015-3 and the function chips 1012-3 and 1013-3 by using wiring patterns formed on the interposer 1011-3. The required electrical power is supplied to the interposer 1011-3 from the power supply 1017 via a bonding wire 1018-3.

The function chips 1012-2, 1012-3, 1013-2, and 1013-3, for example, are semiconductor chips, such as CPUs and memories, capable of carrying out predetermined functions.

Figure 25:
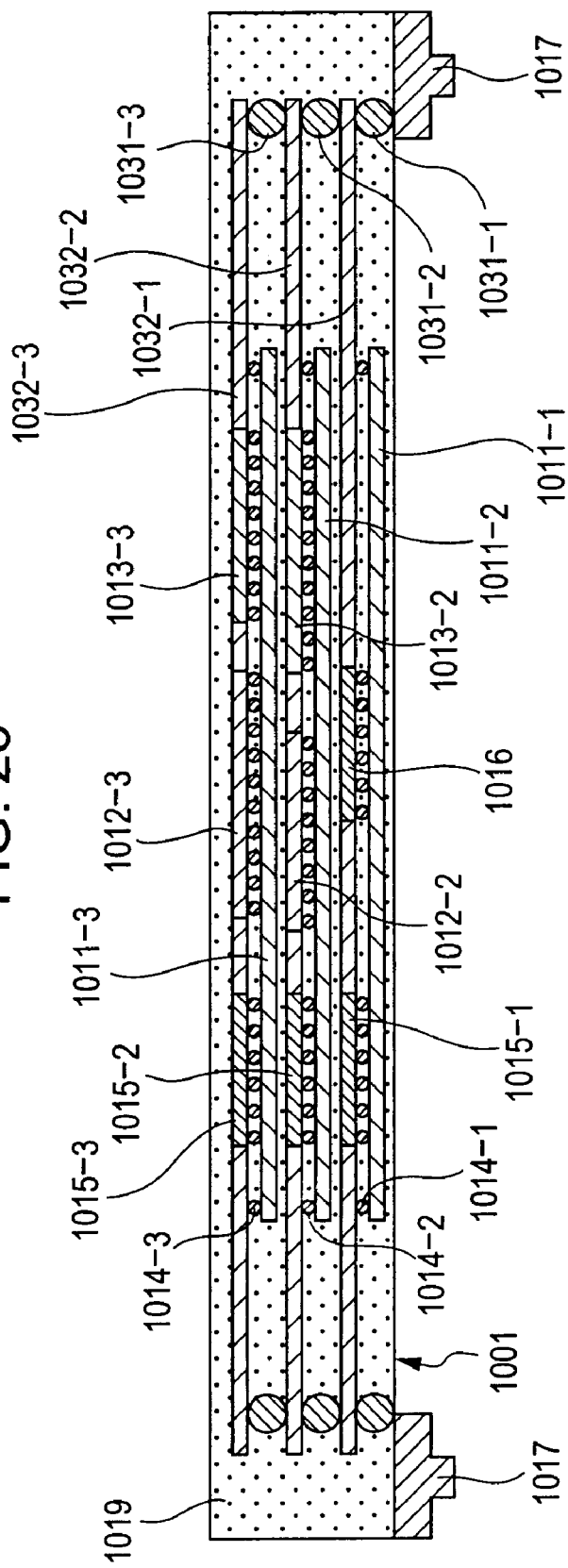
FIG. 25 is a sectional side view of a multi-chip package according to an embodiment of the present invention.
Figure 26:
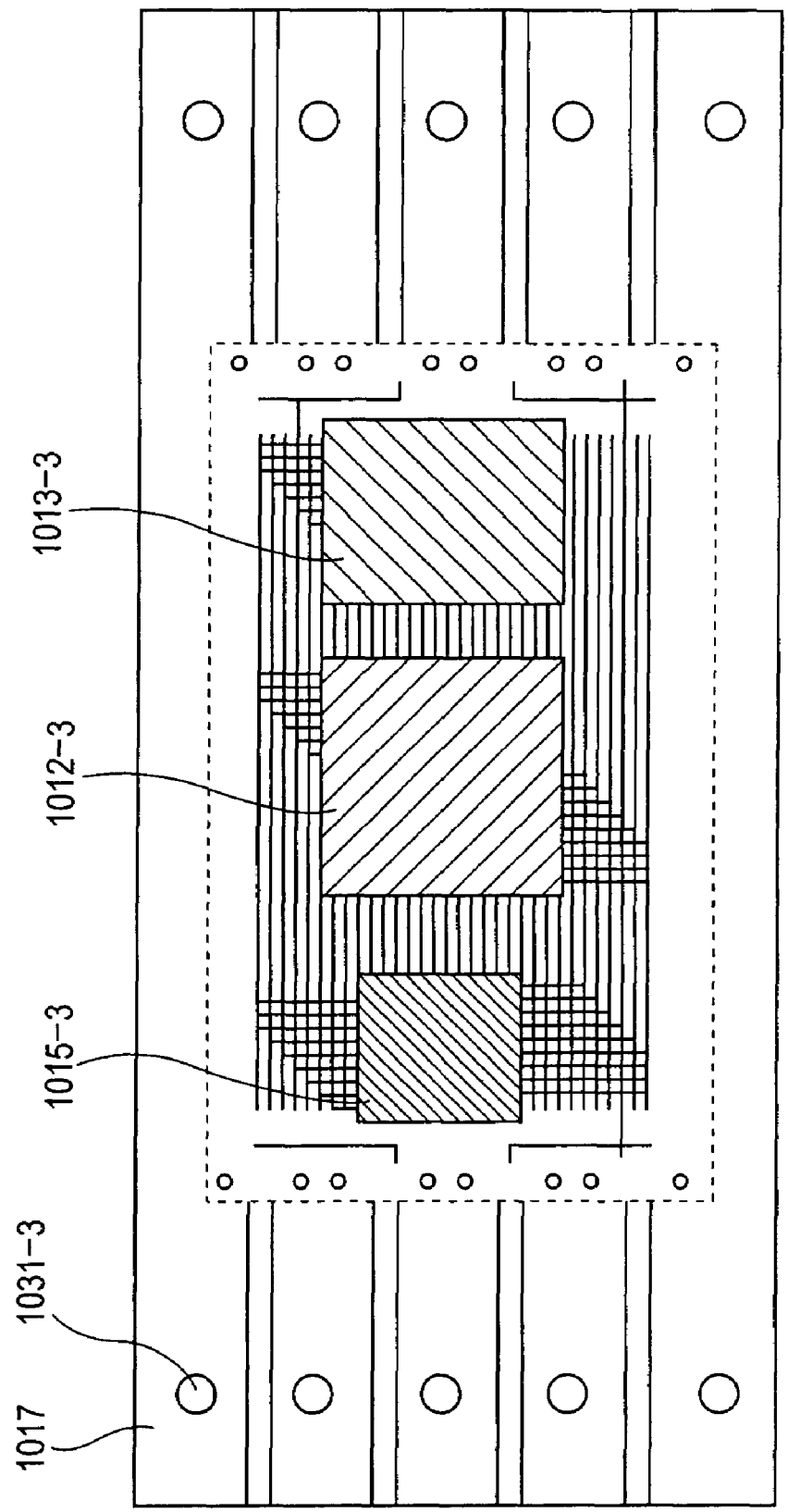
FIG. 26 a plan view of the multi-chip package illustrated in FIG. 25.

FIGS. 25 and 26 illustrate a semiconductor device according to another embodiment. In this embodiment, the required electrical power is supplied from the power supply 1017 to a copper plate 1032-1 via bumps 1014-1. This electrical power is supplied to the interposer 1011-1 via the bumps 1014-1.

Electrical power is supplied to a copper plate 1032-2 above the copper plate 1032-1 from the power supply 1017 via bumps 1031-1, the copper plate 1032-1, and bumps 1031-2. This electrical power is supplied to the interposer 1011-2 via bumps 1014-2. Similarly, electrical power is supplied to a copper plate 1032-3 above the copper plate 1032-3 from the power supply 1017 via the bumps 1031-1, the copper plate 1032-1, the bumps 1031-2, and the copper plate 1032-2. This electrical power is supplied to the interposer 1011-3 via bumps 1014-3. Other structures are the same as those illustrated in FIGS. 23 and 24.

On the copper plate 1032-1, holes are formed at positions corresponding to communication chips 1015-1 and 1016 so that the copper plate 1032-1 does not directly contact the communication chips 1015-1 and 1016. Similarly, on the copper plate 1032-2, holes are formed at positions corresponding to communication chip 1015-2 and function chips 1012-2 and 1013-2, and on the copper plate 1032-3, holes are formed at positions corresponding to communication chip 1015-3 and function chips 1012-3 and 1013-3.

Figure 27:
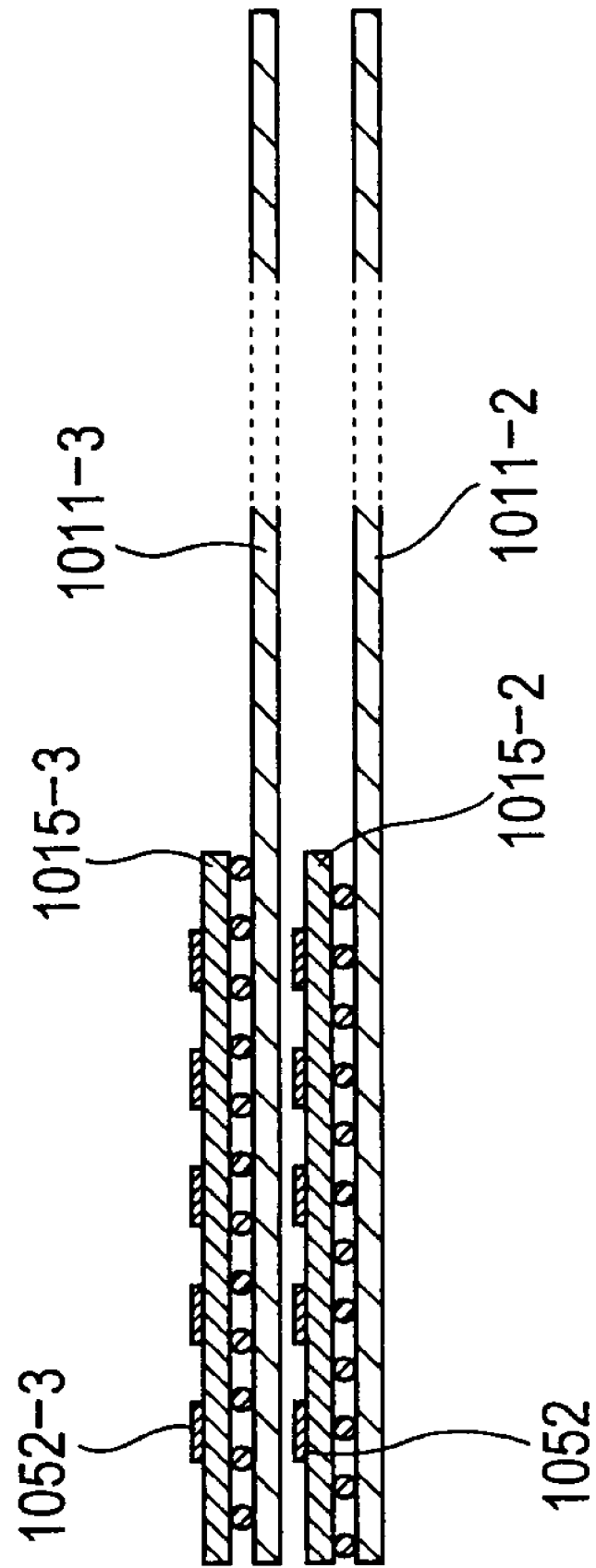
FIG. 27 illustrates a communication module.

The communication chips 1015-1, 1015-2, and 1015-3, as illustrated in FIGS. 23 and 25, are aligned vertically in the drawings. Therefore, as illustrated in FIG. 27, the interposer 1011-2, the communication chip 1015-2 on the interposer 1011-3, a communication module 1052-2 formed on the communication chip 1015-3, and a communication module 1052-3 are provided at positions corresponding to each other. Each of the components is capable of radio-communicating (electromagnetic induction at an extremely close-distance communication) with each other.

Figure 28:
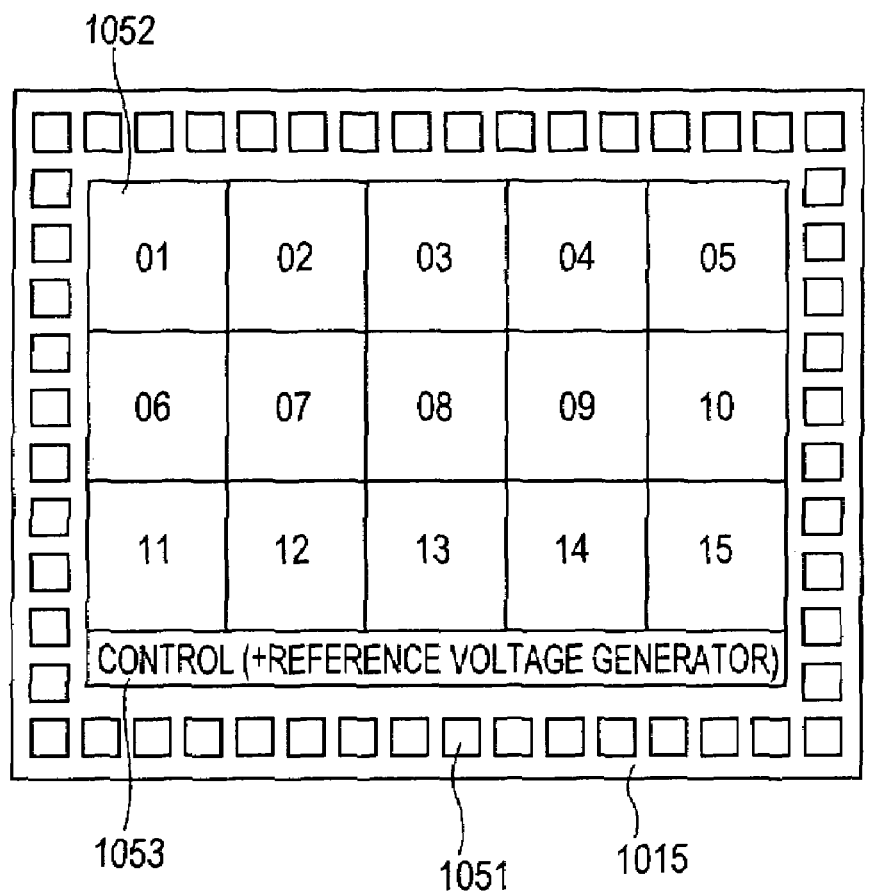
FIG. 28 is a plan view of a communication chip for asynchronous communication.

FIG. 28 is a plan view of a communication chip 1015 for asynchronous communication. In this embodiment, as shown in the drawing, a plurality of pads 1051 is disposed around the periphery of the communication chip 1015 so as to form a square. The pads 1051 include input-output buffers. The pads 1051 are connected via bonding wires or bumps. The pads 1051 are connected to communication modules 1052 via wiring patterns.

According to this embodiment, on the inner sides of the pads 1051, a total of fifteen communication modules 1052 are provided as a 3×5 planar matrix. Each of the communication modules 1052 are numbered 01 through 15. A control unit 1053 is provided at the lower portions of the communication modules 1052. The control unit 1053 controls the communication modules 1052, generates a reference voltage, and supplies the reference voltage to the communication modules 1052.

Figure 29:
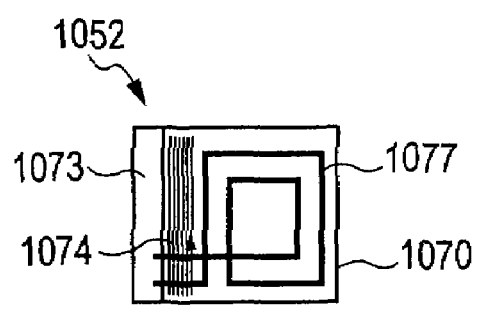
FIG. 29 is a plan view of the communication module illustrated in FIG. 28.

FIG. 29 is a plan view of one of the communication modules 1052. As illustrated in FIG. 29, in the leftmost area, a transmitter circuit 1073 is disposed, on the right to the transmitter circuit 1073, an asynchronous receptor circuit 1074 is disposed, and on the right to the asynchronous receptor circuit 1074, an antenna 1077 is disposed. Wiring 1070 is provided around the transmitter circuit 1073, the asynchronous receptor circuit 1074, and the antenna 1077. The wiring 1070 receives electrical power and signals.

The fifteen communication modules 1052 in the communication chip 1015 are either all for transmission or for reception (in order to carry out two-way communication, communication chips for transmission and communication chips for reception are both required). Instead, part of the fifteen communication modules 1052 may be for transmission and the rest may be reception.

Figure 30:
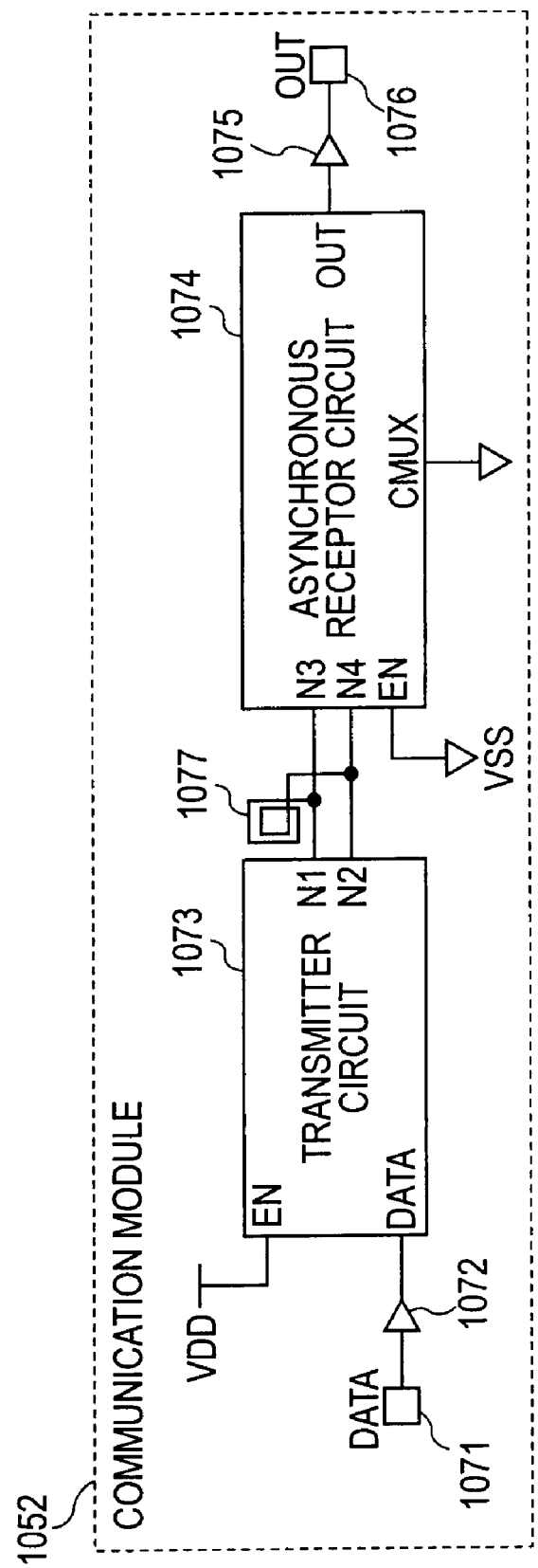
FIG. 30 is a block diagram of communication module for transmission for asynchronous communication.

Each of the communication modules 1052, as illustrated in FIG. 30, basically include a data terminal 1071, an amplifier 1072, a transmitter circuit 1073, an asynchronous receptor circuit 1074, an amplifier 1075, an output terminal 1076, and an antenna 1077. The data terminal (Data) 1071 supplies input data to the amplifier 1072. The amplifier 1072 amplifies the signal input from the data terminal 1071 and sends the amplified signal to a data terminal (Data) of the transmitter circuit 1073. Output terminals N1 and N2 of the transmitter circuit 1073 are connected to input terminals N3 and N4, respectively, of the asynchronous receptor circuit 1074, wherein the antenna 1077 is interposed between the transmitter circuit 1073 and the asynchronous receptor circuit 1074. The asynchronous receptor circuit 1074 outputs the signals sent from the input thermals N3 and N4 from an output terminal OUT. This output is amplified by the amplifier 1075 and is output from the output terminal (OUT) 1076.

The transmitter circuit 1073 includes an enabling terminal EN. When a high reference voltage VDD is applied to the enabling terminal EN, the transmitter circuit 1073 is enabled, and when a low reference voltage VSS is applied, the transmitter circuit 1073 is disabled. Similarly, the asynchronous receptor circuit 1074 is enabled when a high reference voltage VDD is applied to the enabling terminal EN and is disabled when a low reference voltage VSS is applied. The communication module 1052 according to this embodiment illustrated in FIG. 30 is a communication module for transmission. Thus, the transmitter circuit 1073 is enabled, and the asynchronous receptor circuit 1074 is disabled.

In this case, the signal input from the data terminal 1071 is amplified at the amplifier 1072 and then is input to the transmitter circuit 1073. The transmitter circuit 1073 carries out waveform shaping on the input signal and outputs the shaped signal from the antenna 1077.

Figure 31:
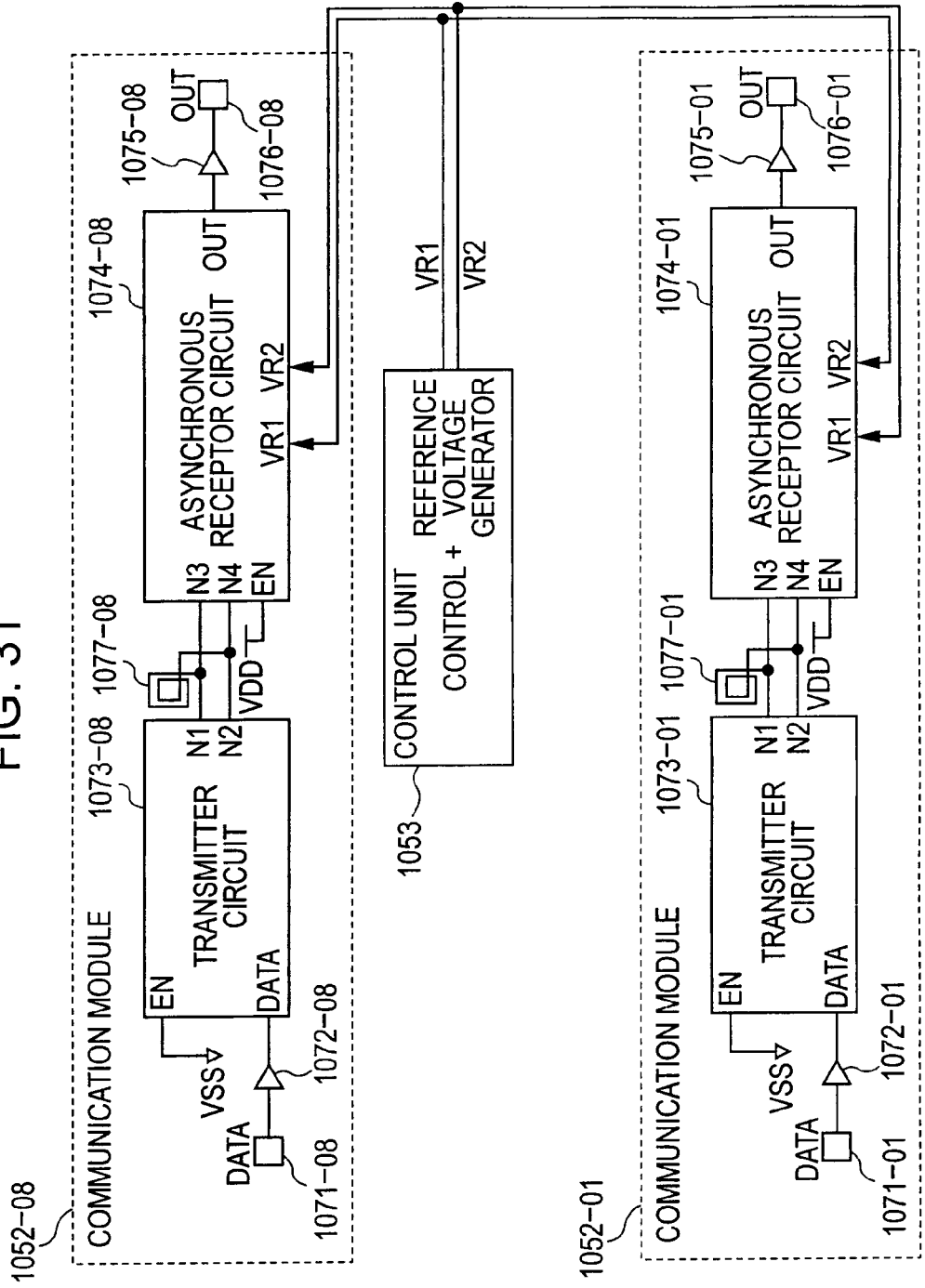
FIG. 31 is a block diagram of communication module for reception for asynchronous communication.
Figure 36:
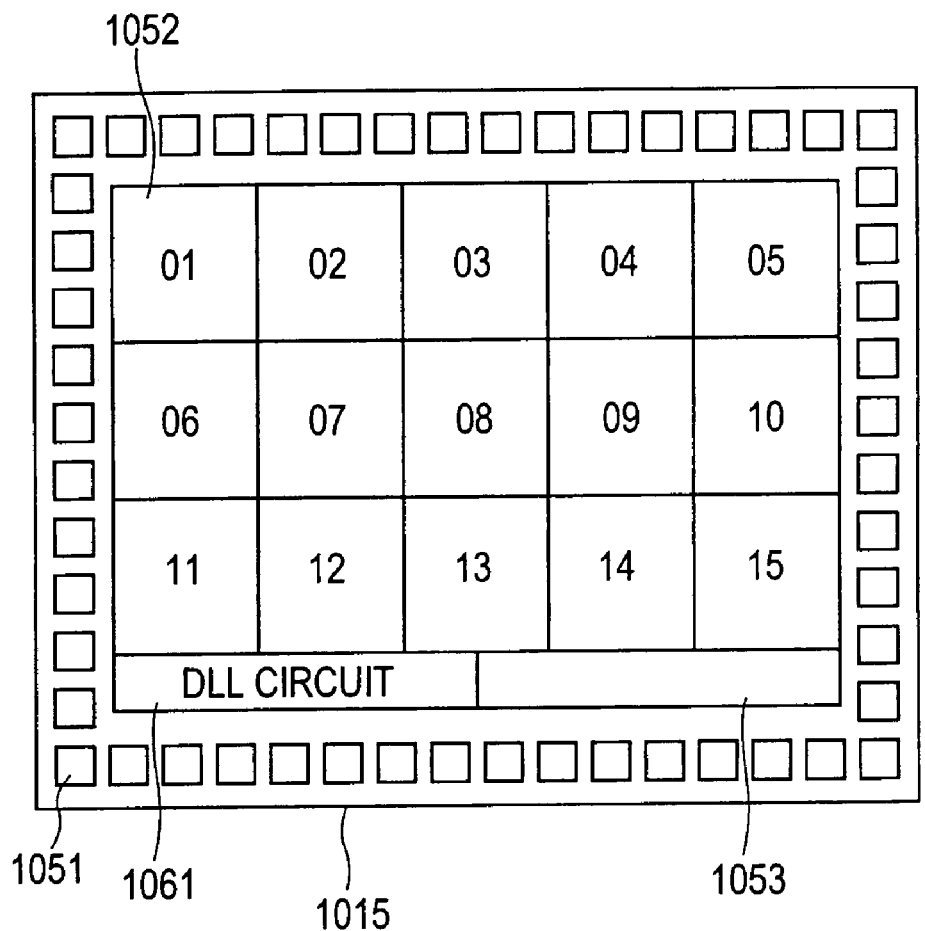
FIG. 36 is plan view of a communication chip for synchronous communication.

FIG. 31 illustrates the structure of one of the communication module in a communication chip 1015 for transmission. In FIG. 31 (and FIG. 39, as described below), the numbers after the hyphens included in the reference numerals indicate the numbers 01 to 15 of the communication modules shown in FIG. 28 (FIG. 36). In this embodiment, a communication module 1052-08 corresponding to the communication module illustrated in the center and indicated by the reference number 08 in FIG. 28 and a communication module 1052-01 corresponding to the communication module and indicated by the reference number 01 in FIG. 28 are discussed. A low reference voltage VSS is supplied to the enabling terminals of transmitter circuits 1073-08 and 1073-01. Therefore, the transmitter circuits 1073-08 and 1073-01 are disabled.

A high reference voltage VDD is supplied to the enabling terminal of an asynchronous receptor circuit 1074-08 of the communication module 1052-08 so as to enable the asynchronous receptor circuit 1074-08. As a result, the asynchronous receptor circuit 1074-08 receives a signal received by an antenna 1077-08 at input terminals N3 and N4 and outputs the signal from a terminal OUT to an amplifier 1075-08. The amplifier 1075-08 amplifies the input signal and outputs the amplified signal to a terminal 1076-08.

Similarly, a high reference voltage VDD is supplied to the enabling terminal of an asynchronous receptor circuit 1074-01 of the communication module 1052-01 so as to enable the asynchronous receptor circuit 1074-08. As a result, the asynchronous receptor circuit 1074-01 receives a signal received by an antenna 1077-01 at input terminals N3 and N4 and outputs the signal from a terminal OUT to an amplifier 1075-01. The amplifier 1075-01 amplifies the input signal and outputs the amplified signal to a terminal 1076-01.

A controller unit 1053 supplies reference voltages VR1 and VR2 to the asynchronous receptor circuits 1074-08 and 1074-01, respectively. As described below with reference to FIG. 34, a positive pulse or a negative pulse is detected at the asynchronous receptor circuits 1074-08 and 1074-01, wherein the reference voltages VR1 and VR2 are threshold values.

Figure 32:
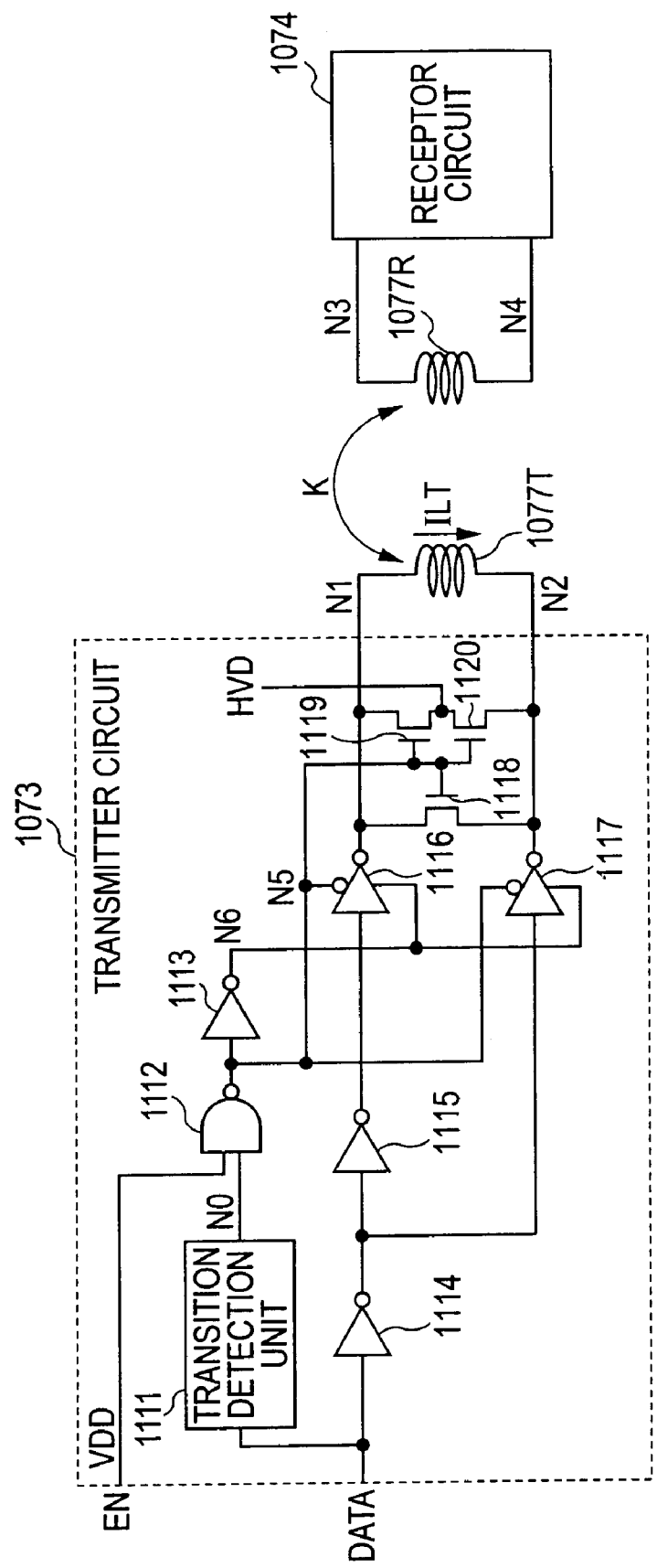
FIG. 32 is a circuit diagram illustrating the structure of a transmitter circuit for asynchronous communication.

FIG. 32 is a detailed view of a transmitter circuit 1073. The transition of a signal input to a data terminal of the transmitter circuits 1073 is detected by a transition detection unit 1111. The transition detection unit 1111 generates a positive pulse when it detects transition and outputs the positive pulse to a node NO. The positive pulse sent to the node NO is input to a NAND circuit 1112. The other input of the NAND circuit 1112 receives a high reference voltage VDD supplied from an enabling terminal. The output of the NAND circuit 1112 is connected to a node N5. The node N5 is also connected to control electrodes of tri-state buffers 1116 and 1117. An output (output of a node N6) from the NAND circuit 1112 inverted by an inverter 1113 is supplied to the other control electrodes of the tri-state buffers 1116 and 1117.

The tri-state buffer 1116 receives a signal sent at the data terminal from inverters 1114 and 1115. The tri-state buffer 1117 receives the output of the inverter 1114. The outputs from the tri-state buffers 1116 and 1117 are sent from output terminals N1 and N2 to both ends of an antenna 1077T for transmission. The output terminals N1 and N2 are connected to a transistor 1118 and to a serial circuit of transistors 1119 and 1120. The control electrodes of the transistors 1118, 1119, and 1120 are connected to the node N5. The connection point of the transistors 1119 and 1120 is connected to a reference voltage HVD. The voltage of the reference voltage HVD, for example, is one half of the voltage of the high reference voltage VDD.

For example, when a signal, as illustrated in FIG. 33A, is input to a data terminal, the transition detection unit 1111 detects the rising edge and the falling edge of the signal, as illustrated in FIG. 33B, and outputs a positive pulse to the node NO. The positive pulse sent to the node NO is inverted by the NAND circuit 1112, as illustrated in FIG. 33C, and is output to the node N5 as a negative pulse. The negative pulse sent to the node N5 inverted by the inverter 1113 and is output to the node 6 as a positive pulse. Accordingly, at the timing when the negative pulse and the positive pulse are supplied to the node 5 and node 6, respectively, the tri-state buffers 1116 and 1117 are enabled and the signal input via the inverters 1114 and 1115 or the signal input via the inverter 1114 is sent to the antenna 1077T. As a result, an electrical current is applied to the antenna 1077T, as illustrated in FIG. 33D. When the voltage of the node N5 is low, the transistors 1118 to 1120 are turned off so as to allow an electrical current to be applied to the antenna 1077T. The an electrical current ILT applied to the antenna 1077T flow in opposite directions when the signal input to the data terminal is at a high level and a low level.

The antenna 1077T of the communication module 1052 for transmission is connected to an antenna 1077R of a communication module 1052 for reception by a coupling factor K. Therefore, when the electrical current ILT is supplied to the antenna 1077T, an electrical current is applied to the antenna 1077R and a voltage is generated at the input terminals N3 and N4 of the receptor circuit 1074, as illustrated in FIG. 33E. As illustrated in FIGS. 33D and 33E, a voltage corresponding to the rising edge of the electrical current ILT at the antenna 1077T is generated, as shown by the solid line in FIG. 33E, and a voltage corresponding to the falling edge of the electrical current ILT at the antenna 1077T is generated, as shown by the dotted line in FIG. 33E.

Figure 34:
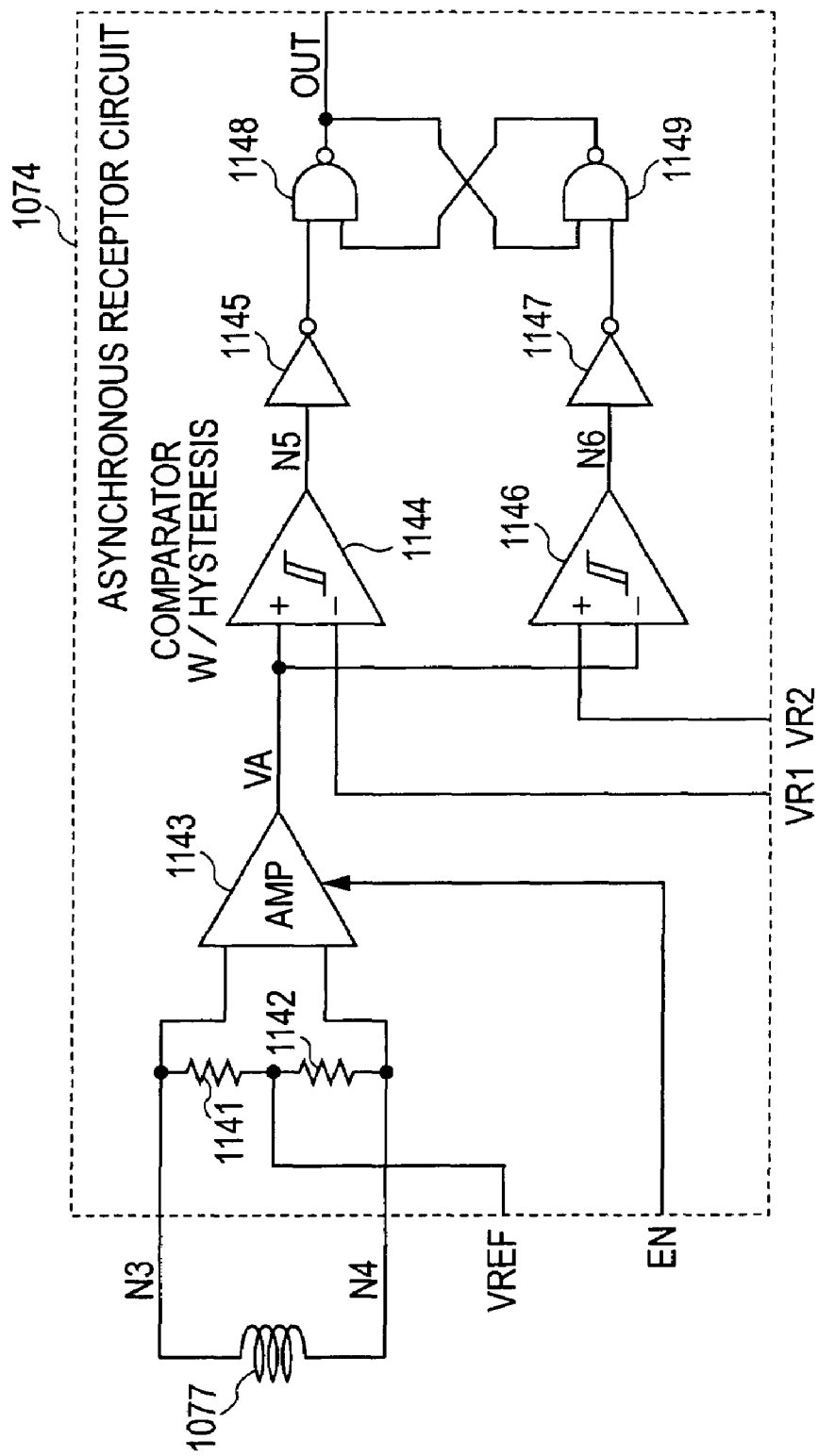
FIG. 34 circuit diagram illustrating the structure of an asynchronous receptor circuit for asynchronous communication.

FIG. 34 illustrates the structure of the asynchronous receptor circuit 1074. The input terminals N3 and N4 are connected to the input terminals of an amplifier 1143. Resistors 1141 and 1142 are connected between the input terminals N3 and N4. A reference voltage VREF is supplied between the resistors 1141 and 1142. The output of the amplifier 1143 is supplied to a non-inverting input terminal of a hysteresis comparator 1144 and an inverting input terminal of a hysteresis comparator 1146. A reference voltage VR1 is supplied to the inverting input terminal of the hysteresis comparator 1146, and a reference voltage VR2 is supplied to the non-inverting input terminal of a hysteresis comparator 1144.

The output (node N5) of the comparator 1144 is connected to one of the inputs of a NAND circuit 1148, which constitutes a cross-latch circuit together with a NAND circuit 1149, via an inverter 1145. The output (node N6) of the comparator 1146 is connected to one of the inputs of a NAND circuit 1149 via an inverter 1147. The output of the NAND circuit 1148 is connected to the other input of the NAND circuit 1149, and the output of the NAND circuit 1149 is connected to the other input of the NAND circuit 1148.

When a signal is sent from the transmission side (FIG. 35A), a voltage is generated at the antenna 1077 (input terminals N3 and N4) due to electromagnetic induction (FIG. 35B). The amplifier 1143 amplifies the signal input from the antenna 1077 and outputs the amplified signal to a node VA (FIG. 35C). The comparator 1144 compares the signal sent from the amplifier 1143 with the reference voltage VR1 and, if the reference voltage VR1 is greater, outputs a positive pulse to the node N5 (FIG. 35D). Similarly, the comparator 1146 compares the signal sent from the amplifier 1143 with the reference voltage VR2 and, if the reference voltage VR2 is smaller, outputs a positive pulse to the node N6 (FIG. 35E). The outputs form the nodes N5 and N6 are inverted by the inverters 1145 and 1147, respectively, and latched by the cross-latch circuit that inverts the output each time a negative pulse is input (FIG. 35F).

When carrying out communication using the communication chip 1015 with the clocked synchronized, a structure such as that illustrated in FIG. 36 is employed. The basic structure is the same as that illustrated in FIG. 28. However, in the embodiment illustrated in FIG. 36, a delay locked loop (DLL) circuit 1161 is added to the structure. Among the communication modules 1052 represented by the reference numerals 01 to 15, at least one, for example, the one represented by the reference numeral 08, is capable of carrying out asynchronous communication and the other communication modules 1052 represented by the reference numerals 01 to 07 and 09 to 15 are capable of carrying out synchronous communication.

Figure 37:
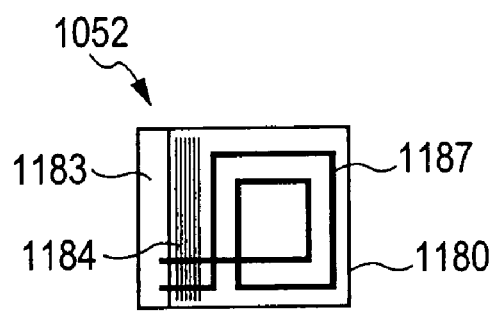
FIG. 37 is plan view of a communication module illustrated in FIG. 36.

FIG. 37 is a plan view of one of the communication modules 1052 illustrated in FIG. 36 capable of carrying out synchronous communication (i.e., one of the communication modules 1052 represented by the reference numerals 01 to 07 and 09 to 15) (the plan view of the communication modules 1152 represented by the reference numeral 08 capable of carrying out asynchronous communication is illustrated in FIG. 29). As illustrated in FIG. 37, the communication modules 1052 capable of carrying out synchronous communication includes a transmitter circuit 1183, a synchronous receptor circuit 1184, an antenna 1187, and a wiring 1180. The plan view of the communication modules 1052 capable of carrying out synchronous communication is the same as the plan view in FIG. 29 except that the asynchronous receptor circuit 1074 is replaced by the synchronous receptor circuit 1184.

Figure 38:
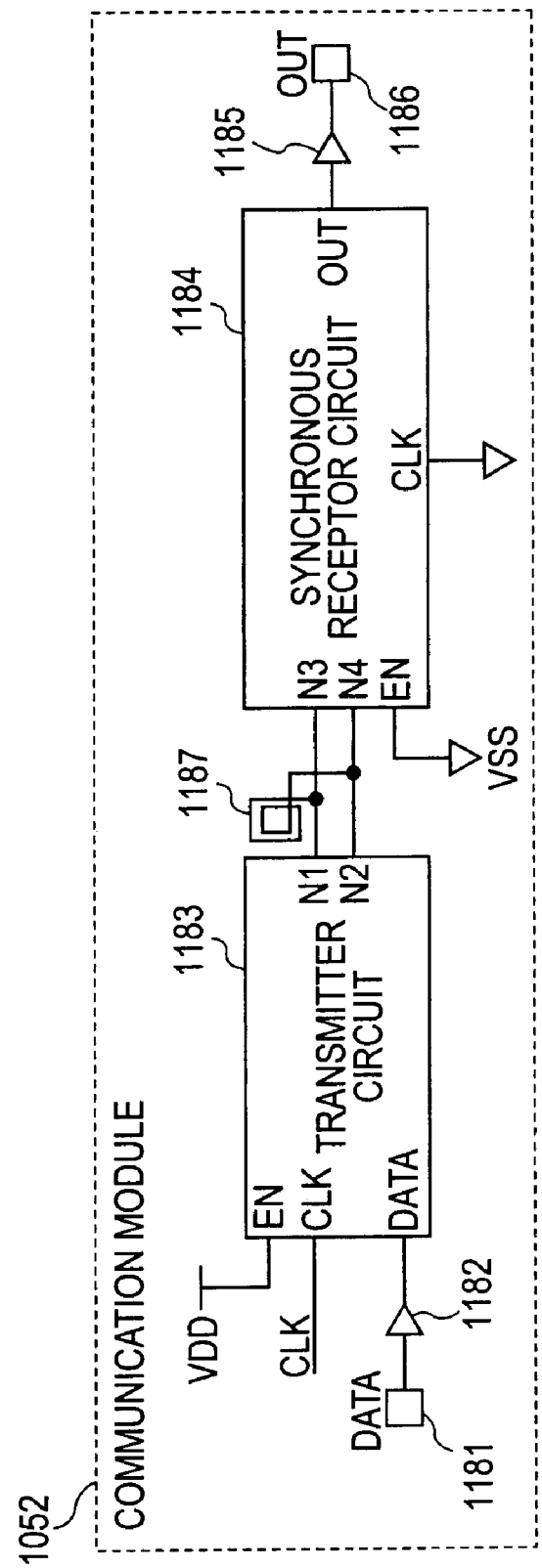
FIG. 38 is a block diagram illustrating the structure of a communication module for transmission operating in synchronization with a clock.

The communication modules 1052 for synchronous communication, for example, includes a data terminal 1181, an amplifier 1182, a transmitter circuit 1183, a synchronous receptor circuit 1184, an amplifier 1185, an output terminal 1186, and an antenna 1187, as illustrated in FIG. 38 (the communication module 1052 for asynchronous communication represented by the reference numeral 08 has a structure the same as that illustrated in FIG. 30). The basic structure of the communication modules 1052 illustrated in FIG. 38 is substantially the same as that of the communication module 1052 for asynchronous communication illustrated in FIG. 30 except that the transmitter circuit 1183 and the synchronous receptor circuit 1184 have clock terminals and operate synchronously with the input clock signal. The other structures are the same as those illustrated in FIG. 30.

FIG. 38 illustrates a communication module for transmission according to this embodiment. Accordingly, the synchronous receptor circuit 1184 illustrated in FIG. 38 is disabled since a low voltage VSS is supplied to the enabling terminal EN. The transmitter circuit 1183 is enabled since a high voltage VDD is supplied to the enabling terminal EN.

Figure 39:
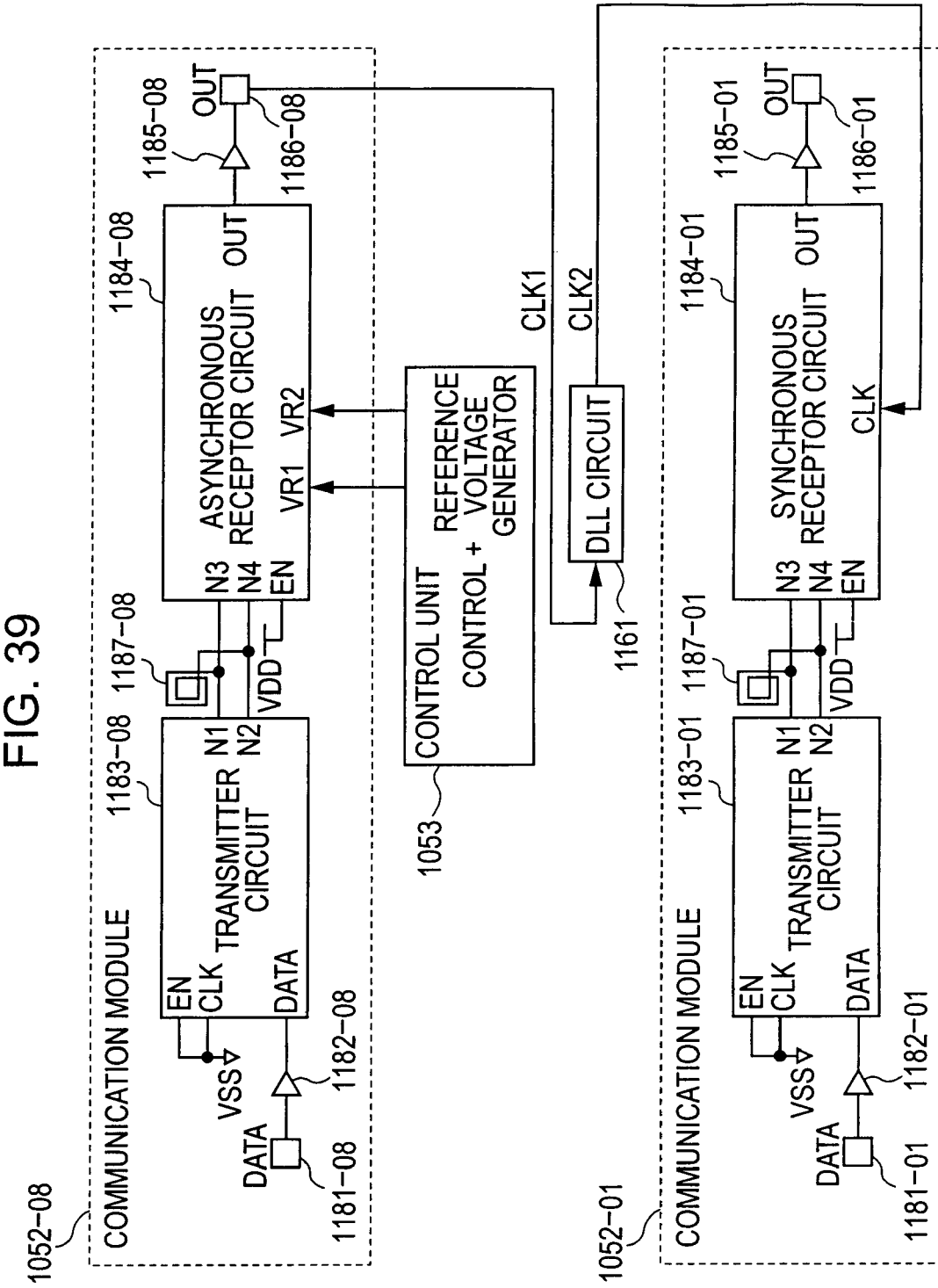
FIG. 39 is a block diagram illustrating the structure of a communication module for reception operating in synchronization with a clock.

FIG. 39 illustrates the basic connection between the communication module 1052-08 of the communication modules 1052 of the communication chip 1015 for reception capable of carrying out synchronous communication and the communication module 1052-01. A low voltage VSS is supplied to the enabling terminals of a transmitter circuit 1183-08 of the communication module 1052-08 and a transmitter circuit 1183-01 of the communication module 1052-01 and, as a result, the transmitter circuits 1183-08 and 1183-01 are disabled. Contrastingly, a high reference voltage VDD is supplied to the enabling terminals of an asynchronous receptor circuit 1184-08 and a synchronous receptor circuit 1184-01 and, as a result, the asynchronous receptor circuits 1184-08 and 1184-01 are enabled.

Consequently, a signal received by an antenna 1187-08 is sent to an amplifier 1185-08 via the asynchronous receptor circuit 1184-08 and is amplified. The amplified signal is supplied to the DLL circuit 1161 from the terminal 1186-08. More specifically, a clock output from the transmitter circuits 1183-08 of the communication module 1052-08, which is a communication module shown in FIG. 38 for transmission, via the antenna 1187-08 is output as a clock via the antenna 1187-08 of the communication module 1052-08, which is a communication module shown in FIG. 38 for reception, the asynchronous receptor circuits 1184-08, and the amplifier 1185-08.

The DLL circuit 1161 delays a clock CLK1 sent from the terminal 1186-08 for a predetermined amount of time (i.e., modulates the clock CLK1) and sends the delayed clock CLK2 as a clock CLK2 to the synchronous receptor circuits 1184-01 (although not shown in the drawings, the clock CLK2 is also sent to the synchronous receptor circuits 1184-02 to 1184-07 and 1184-09 to 1184-15 for reception). The synchronous receptor circuits 1184-01 operated synchronously with the clock CLK2. More specifically, the signal received by the antenna 1187-01 is received by the synchronous receptor circuits 1184-01 synchronously with the clock, amplified at the amplifier 1185-01, and output from the terminal 1186-01.

A control unit 1053 supplies reference voltages VR1 and VR2 to the asynchronous receptor circuits 1184-08 (having the same structure as that of the synchronous receptor circuits 1074 illustrated in FIG. 34). The values of the reference voltages VR1 and VR2 are predetermined based on experiments.

FIG. 40 illustrates the structure of the DLL circuit 1161 functioning as a modulating circuit. The DLL circuit 1161 includes a variable delaying unit 1201, a clock distribution delay replica 1202, and a control unit 1203. The variable delaying unit 1201 delays an input clock CLK1 by a predetermined amount of time Ta and outputs a clock CLK2. The clock CLK2 is delayed at the clock distribution delay replica 1202 by a predetermined amount of time Tb and is output as a clock CLK2A. The control unit 1203 controls the amount of time Ta delayed by the variable delaying unit 1201 and increases the amount of time Ta when the phase of the clock CLK2A is delayed or decreases the amount of time Ta when the phase of the clock CLK2A is hastened so that there is no phase difference between the clock CLK2A and the clock CLK1.

More specifically, as illustrated in FIG. 41A, when a signal (clock) received by the antenna 1187-08 is sent to the terminals N3 and N4 of the asynchronous receptor circuits 1184-08 in FIG. 39, the signal is input to the DLL circuit 1161 as a clock CLK1 (FIG. 41B). The DLL circuit 1161 is delayed by the amount of time Ta of the clock CLK1 and outputs a clock CLK2 (FIG. 41C).

For example, when a signal received by the antenna 1187-01 is sent to the terminals N3 and N4 of the asynchronous receptor circuits 1184-01 (FIG. 41D), the clock CLK2 must be timed so that it is suitable for processing the signal. In other words, as described below with reference to FIG. 45, nodes NC1 and NC2 of the synchronous receptor circuit 1184-01 each require a clock having a predetermined timing (FIGS. 41E and 41F). The clock distribution delay replica 1202 modulates this timing by delaying the clock CLK2 by an amount of time Tb and generating a clock CLK2A. In other words, accurate clock synchronization can be carried out by modulating phases of the clock CLK1 and clock CLK2A so that there is no phase difference.

Figure 42:
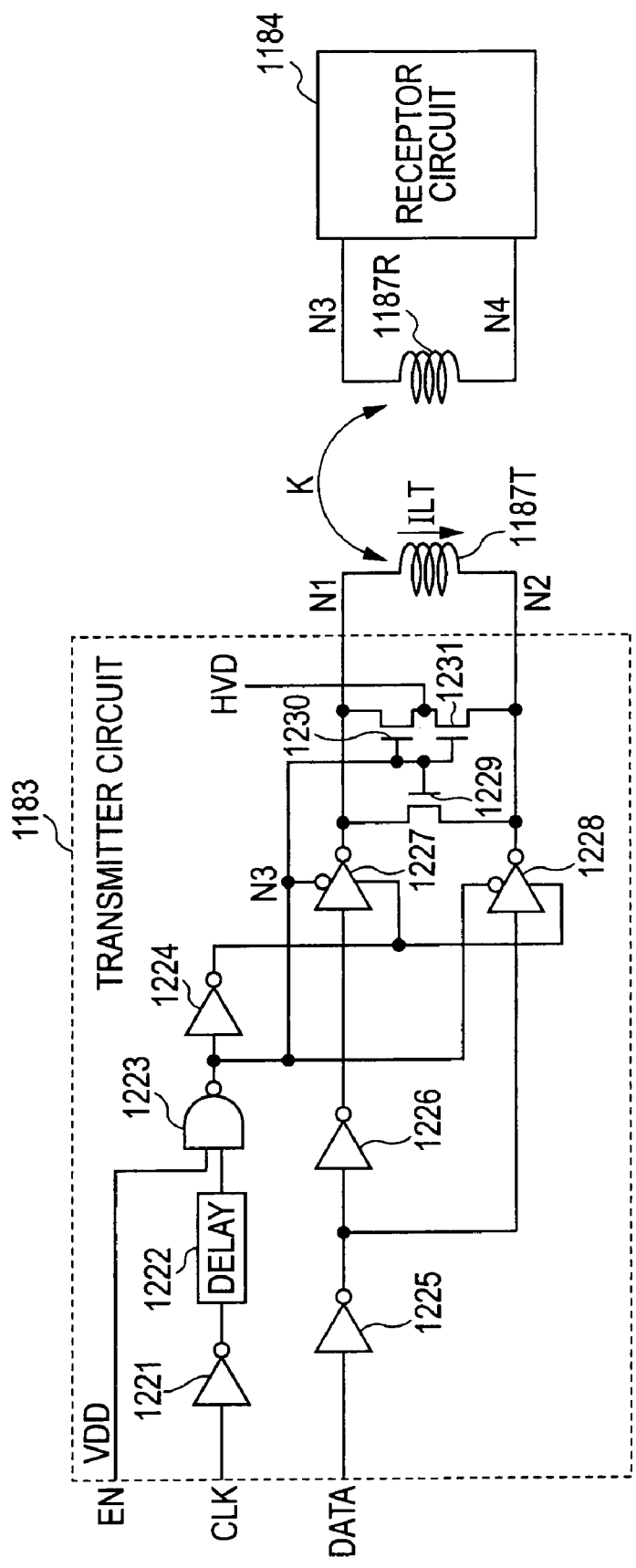
FIG. 42 is circuit diagram illustrating the structure of a transmitter circuit operating in synchronization with a clock.

FIG. 42 illustrates the structure of the transmitter circuit 1183 (FIG. 38) that operates in synchronization with a clock. An inverter 1221 detects the rising edge of a clock by a delaying circuit 1222 and a NAND circuit 1223. The structure of the NAND circuit 1223, non-inverters 1224 to 1226, tri-state buffers 1227 and 1228, and transistors 1229 to 1231 are basically the same as the structure of the NAND circuit 1112, the inverters 1113 to 1115, the tri-state buffers 1116 and 1117, and the transistors 1118 to 1120.

When a clock (FIG. 43A) is input to a clock terminal, the inverter 1221, the delaying circuit 1222, and the NAND circuit 1223 detects the rising edge of the clock. At the same, a negative pulse (FIG. 43B) synchronized with the rising edge of the clock is sent to the output (node N3) of the NAND circuit 1223 and the inverter 1224 outputs a positive pulse. In this way, the tri-state buffers 1227 and 1228 are enabled during the time the negative pulse is output to the node N3 and supplies input data (FIG. 43C) to an antenna 1187T. Accordingly, an electrical current ILT (FIG. 43D) is applied to the antenna 1187T. An electrical current is applied to an antenna 1187R for reception coupled to the antenna 1187T at a coupling factor K due to electromagnetic induction and a voltage (FIG. 43E) is generated at the input terminals N3 and N4 of the receptor circuit 1184.

Figure 44:
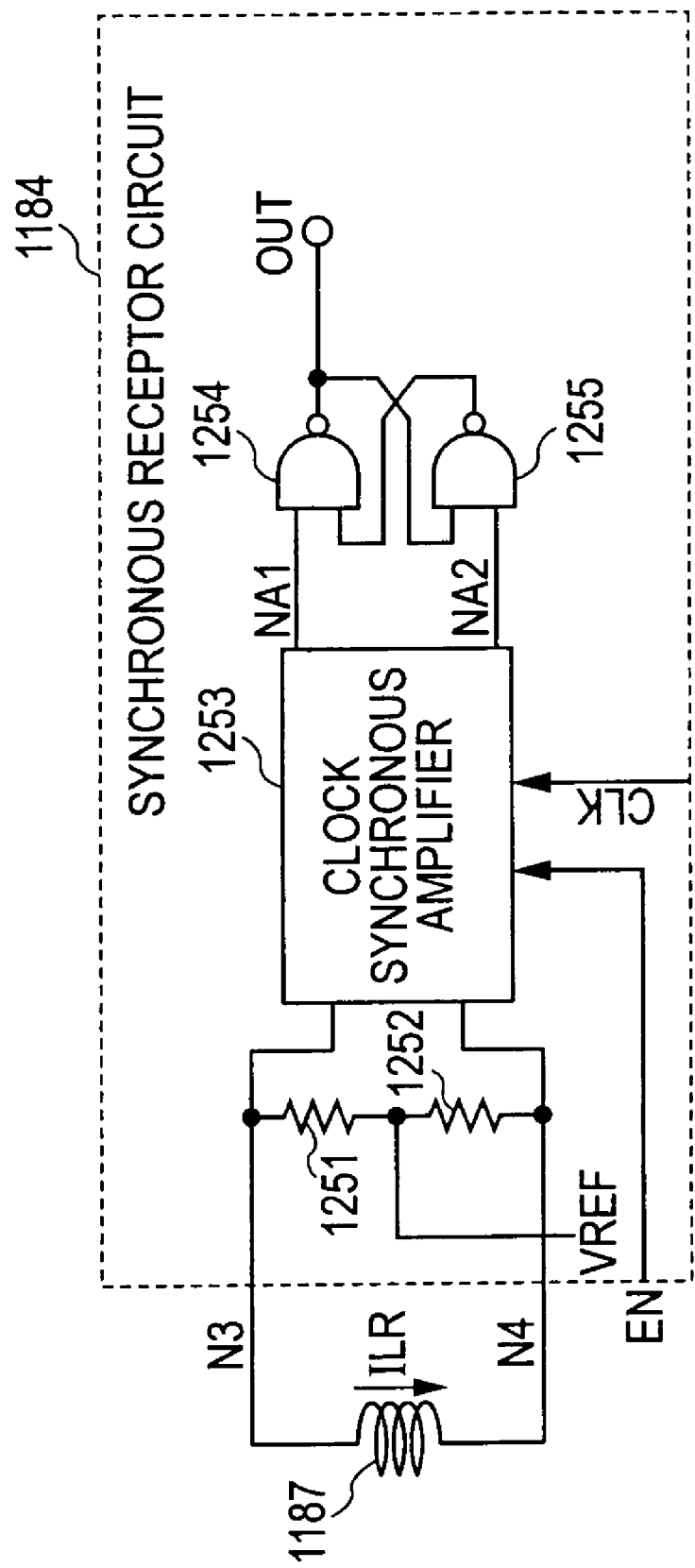
FIG. 44 is circuit diagram illustrating the structure of a synchronous receptor circuit operating in synchronization with a clock.

FIG. 44 illustrates the synchronous receptor circuit 1184 (FIG. 39). As illustrated in FIG. 44, the terminals N3 and N4 of antenna 1187 are connected to the input terminals of the clock synchronous amplifier 1253. Resisters 1251 and 1252 are connected between the terminals N3 and N4. A reference voltage VREF is supplied to the connecting point of the resisters 1251 and 1252. Output terminals NA1 and NA2 of the clock synchronous amplifier 1253 are connected to a cross-latch circuit including NAND circuits 1254 and 1255.

A signal sent from the antenna 1187 is synchronized and amplified by the clock synchronous amplifier 1253 and is latched by the cross-latch circuit including NAND circuits 1254 and 1255.

Figure 45:
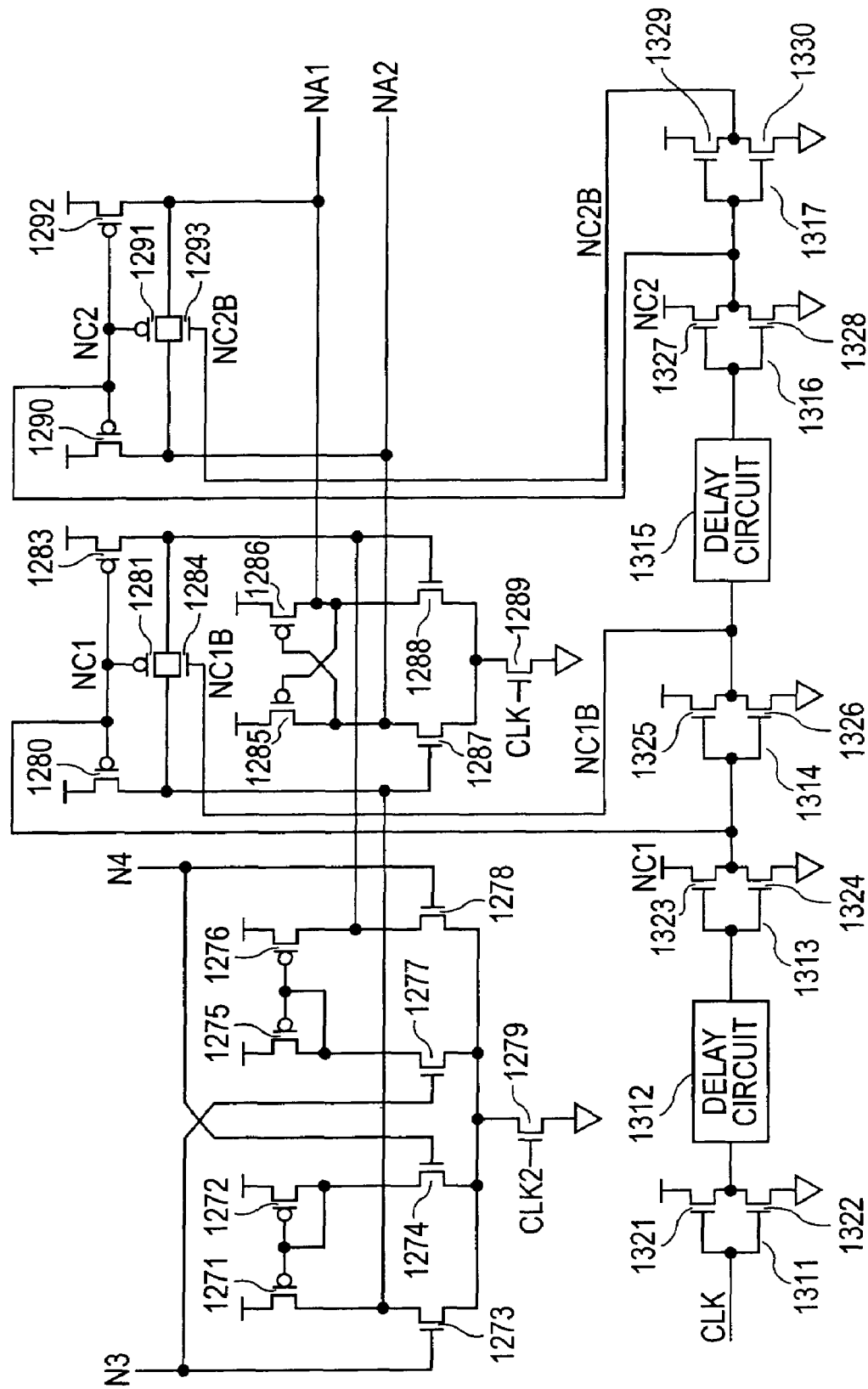
FIG. 45 is circuit diagram illustrating the structure of the clock synchronous amplifier illustrated in FIG. 44.

The structure of the clock synchronous amplifier 1253, for example, is illustrated in FIG. 45. As illustrated in FIG. 45, in the clock synchronous amplifier 1253, the gates of a transistor 1271 and 1272 are connected to each other. The source of the transistor 1271 is connected to the drain of a transistor 1273, and the source of the transistor 1272 is connected to the drain of a transistor 1274. The common connecting point of the sources of the transistors 1273 and 1274 is connected to the drain of a transistor 1279. The gate and the source of the transistor 1272 are connected. The gates of the transistors 1275 and 1276 are connected to each other. The gate and source of the transistor 1275 are connected. The source of the transistor 1275 is connected to the drain of a transistor 1277, and the source of a transistor 1278 is connected to the drain of the transistor 1278. The common connecting point of the sources of the transistors 1277 and 1278 is connected to the drain of the transistor 1279.

The gates of the transistors 1273 and 1277 are connected to a terminal N3, and the gates of the transistors 1274 and 1278 are connected to a terminal N4.

The gates of the transistors 1280, 1281, and 1283 are connected to a node NC1. The source of the transistor 1280 is connected to the gate of the transistor 1287 and the drain of the transistor 1283. The source of the transistor 1280 is also connected to the sources of the transistors 1281 and 1284. The source of the transistor 1284 is connected to the drains of the transistors 1281 and 1284 and to the source of the transistor 1276. The source of the transistor 1283 is also connected to the gate of a transistor 1288. The gate of the transistor 1284 is connected to a node NC1B.

The source of a transistor 1285 is connected the drain of the transistor 1287 and to the gate of a transistor 1286. The source of the transistor 1286 is connected to the gate of the transistor 1285 and to the drain of the transistor 1288. The sources of the transistors 1287 and 1288 are connected to each other, and this connecting point is connected to the drain of a transistor 1289.

The gates of transistors 1290, 1291, and 1292 are connected to a node NC2. The source of the transistor 1290 is connected to the source of the transistor 1291 and the source of a transistor 1293 and to the drain of the transistor 1287. The source of the transistor 1292 is connected to the drains of the transistors 1291 and 1293 and to the source of the transistor 1286. The source of the transistor 1290 and the drain of the transistor 1287 are connected to a terminal NA2, and the source of the transistor 1292 and the drain of the transistor 1288 are connected to a terminal NA1.

A clock CLK2 output from the clock distribution delay replica 1202, illustrated in FIG. 40, is supplied to the gates of the transistors 1279 and 1289. After the clock CLK2 is inverted by an inverter 1311, the clock CLK2 is delayed by a delaying circuit 1312. The clock delayed by the delaying circuit 1312 is reinverted by an inverter 1313 and output to a node NC1, and then an inverter 1314 inverts the reinverted clock and sends it to a node NC1B. The clock sent to the node NC1B is delayed even more by a delaying circuit 1315. The clock delayed by the delaying circuit 1315 is inverted by an inverter 1316 and sent to a node NC2. Then, the clock at the node NC2 is inverted by an inverter 1317 and is output to a node NC2B.

The inverter 1311 includes transistors 1321 and 1322. Similarly, the inverter 1313 includes transistors 1323 and 1324, the inverter 1314 includes transistors 1325 and 1326, the inverter 1315 includes transistors 1327 and 1328, and the inverter 1317 includes transistors 1329 and 1330.

In comparison to the clock CLK2 used for a first circuit including the transistors 1271 to 1279, the clock (the clock for nodes NC1 and NC1B) used for a second circuit including the transistors 1280 to 1289 is delayed by a predetermined amount of time by the delaying circuit 1312, and the clock (the clock for nodes NC2 and NC2B) used for a third circuit including the transistors 1290 to 1293 is delayed even more by a predetermined amount of time by the delaying circuit 1315. The signal sent from the terminals N3 and N4 is amplified at each circuit and is output from the terminals NA1 and NA2.

Figure 46:
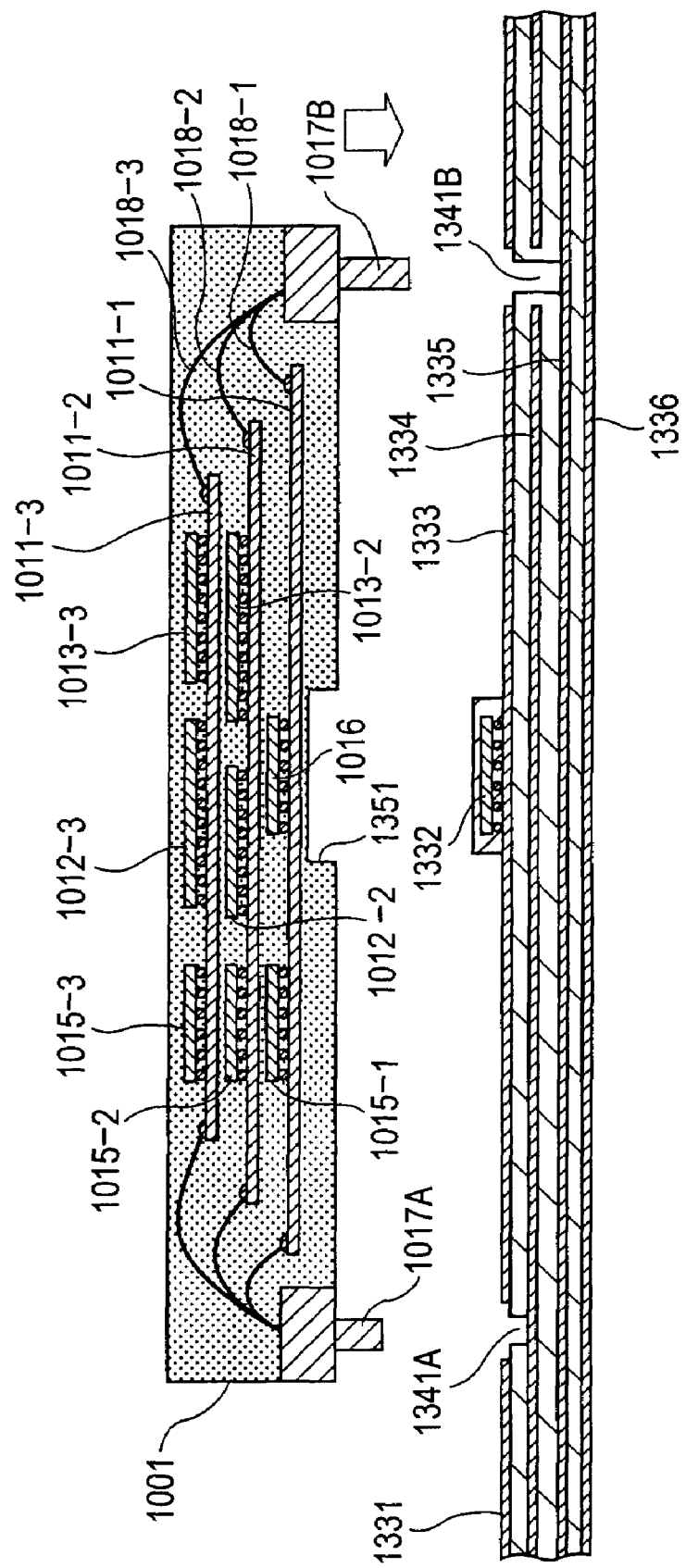
FIG. 46 is a sectional side view showing the structure of a multi-chip package mounted on a wiring substrate.
Figure 47:
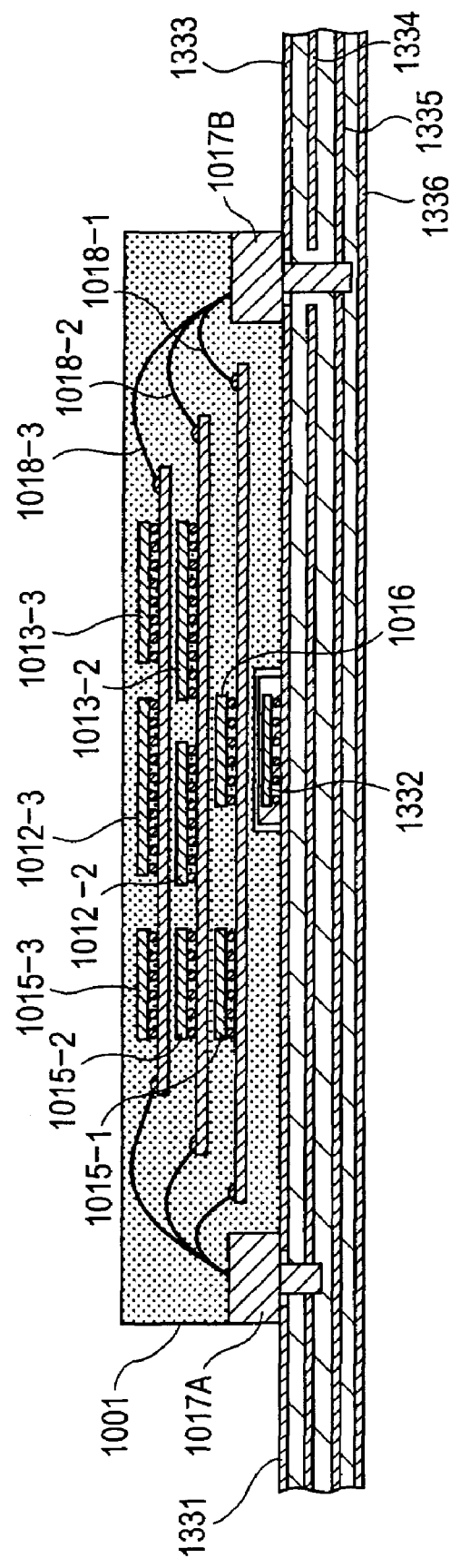
FIG. 47 is a sectional side view showing another structure of a multi-chip package mounted on a wiring substrate.

As described above, the multi-chip package 1001, for example, is installed to an external substrate as illustrated in FIGS. 46 and 47. FIG. 46 illustrates the multi-chip package 1001 before it is mounted on a wiring substrate 1331. FIG. 47 illustrates the multi-chip package 1001 after it is mounted on a wiring substrate 1331.

As illustrated in the drawings, on the bottom of the multi-chip package 1001, a depression 1351 is formed at a position corresponding to a communication chip 1332 disposed on the wiring substrate 1331. When the multi-chip package 1001 is mounted on the wiring substrate 1331, the communication chip 1016 inside the multi-chip package 1001 and the communication chip 1332 on the wiring substrate 1331 are disposed opposite and sufficiently close to each other.

A power-supply electrode 1017A provided at the left in the drawing is disposed in a through-hole 1341A and connected to the second wiring 1334 from the top of the wiring substrate 1331. A power-supply electrode 1017B provided at the left in the drawing is disposed in a through-hole 1341B and connected to the third wiring 1335 from the top of the wiring substrate 1331. The wiring substrate 1331 includes metal wiring 1333 to 1336 for supplying electrical power to the components.

Compared to when the bottom of the multi-chip package 1001 is thin and even, as illustrated in FIGS. 23 and 25, by forming the depression 1351 at a position corresponding to the communication chip 1332 mounted on the wiring substrate 1331, which is an external substrate, as illustrated in FIGS. 46 and 47, only portion corresponding to the depression 1351 has to be formed with a reduced-thickness. In this way, the inside of the multi-chip package 1001 can be reliably protected.

In embodiments of the present invention, the term "system" refers to a device constituting a plurality of devices.

A semiconductor device according to an embodiment of the present invention can include a large number of terminals and has a reduced size.

A semiconductor device according to an embodiment of the present invention can be produced at low costs and in a short amount of time.

A substrate according to an embodiment of the present invention can include a large number of terminals and has a reduced size. Moreover, the substrate can be produced at low costs and in a short amount of time.

An equipment board according to an embodiment of the present invention can be easily produced at low costs.

A semiconductor device according to an embodiment of the present invention can include a large number of terminals and has a reduced size and produced at low costs.

A semiconductor chip for communication according to an embodiment of the present invention is capable of easily communicating between predetermined substrates by mounting the semiconductor chip to a substrate. Accordingly, through-holes for communication do not have to be formed in the substrates, allowing the substrates to have a common structure and simplifying the design of the substrates.

In a semiconductor chip for communication according to an embodiment of the present invention, substrates having common structures can be used for semiconductor chip for communication and, thus, a semiconductor device can be provided at low production costs.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   a plurality of substrates including semiconductor chips having predetermined functions, the substrates being disposed substantially parallel to each other,
   wherein the semiconductor chips are for communication and are disposed at positions corresponding to the each other with respect to the substrates, each of the semiconductor chips including a planar matrix of a plurality of communication modules formed of coiled pattern antennas for receiving or transmitting radio signals.

2. The semiconductor device according to claim 1, wherein additional semiconductor chips for radio-communicating with semiconductor chips mounted on an outer substrate are mounted on one of the substrates disposed closest to the outer substrate.

3. The semiconductor device according to claim 1, wherein a depression is formed at a position corresponding to a semiconductor chip for communication mounted on an outer substrate.

4. The semiconductor device according to claim 1, wherein each of the communication modules includes,
   an antenna,
   at least one of a transmitter circuit for transmitting a signal to the antenna and a receptor circuit for receiving a signal from the antenna, and
   wiring for supplying electrical power and signals to one of the transmitter circuit and the receptor circuit.

5. The semiconductor device according to claim 4,
wherein each of the communication modules include both the transmitter circuit and the receptor circuit,
wherein the antenna is connected to an output of the transmitter circuit and an input of the receptor circuit, and
wherein the transmitter circuit and the receptor circuit include terminals that can be individually set to one of an enabled state and a disabled state.

6. The semiconductor device according to claim 4, further comprising:
a control unit for commonly controlling the communication modules.

7. The semiconductor device according to claim 4,
wherein at least one of the receptor circuits of the communication modules is an asynchronous receptor circuit and the other receptor circuits are synchronous receptor circuits, and
wherein the semiconductor chips for communication further include a modulating circuit for modulating a clock signal supplied to the synchronous receptor circuits based on a signal from the asynchronous receptor circuit.

* * * * *